US009595468B2

(12) United States Patent
Hanawa et al.

(10) Patent No.: US 9,595,468 B2
(45) Date of Patent: Mar. 14, 2017

(54) METHOD OF MANUFACTURING SEMICONDUCTOR DEVICE THAT USES TREATMENT TO ENHANCE HYDROPHILICITY OF SPIN COATED INSULATING FILM

(71) Applicant: Renesas Electronics Corporation, Tokyo (JP)

(72) Inventors: Toshikazu Hanawa, Ibaraki (JP); Kazuhide Fukaya, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/053,481

(22) Filed: Feb. 25, 2016

(65) Prior Publication Data
US 2016/0254143 A1 Sep. 1, 2016

(30) Foreign Application Priority Data

Feb. 27, 2015 (JP) ................... 2015-039120

(51) Int. Cl.
*H01L 21/768* (2006.01)
*H01L 21/02* (2006.01)
(52) U.S. Cl.
CPC .... *H01L 21/76826* (2013.01); *H01L 21/0234* (2013.01); *H01L 21/02164* (2013.01); *H01L 21/02282* (2013.01); *H01L 21/02315* (2013.01)

(58) Field of Classification Search
CPC ......... H01L 21/02164; H01L 21/02214; H01L 21/02282; H01L 21/02312; H01L 21/02315; H01L 21/02337; H01L 21/0234; H01L 21/76826; H01L 21/76828
See application file for complete search history.

(56) References Cited

U.S. PATENT DOCUMENTS 6,133,163 A * 10/2000 Tanaka .............. H01L 21/76828
257/E21.259
6,274,516 B1 * 8/2001 Kamei ................ H01L 21/3105
257/E21.241

FOREIGN PATENT DOCUMENTS

JP 08-330306 A 12/1996
JP 09-161330 A 6/1997
JP 09-241518 A 9/1997

* cited by examiner

*Primary Examiner* — Stephen W Smoot
(74) *Attorney, Agent, or Firm* — McDermott Will & Emery LLP

(57) ABSTRACT

To provide a semiconductor device having improved reliability. After formation of a first insulating film for an interlayer insulating film by spin coating, the surface of the first insulating film is subjected to a hydrophilicity improving treatment. A second insulating film for the interlayer insulating film is then formed on the first insulating film by spin coating. The interlayer insulating film is comprised of a stacked insulating film including the first insulating film and the second insulating film thereon. The interlayer insulating film therefore can have improved surface flatness.

9 Claims, 24 Drawing Sheets

OXYGEN PLASMA TREATMENT

METHOD OF MANUFACTURING SEMICONDUCTOR DEVICE THAT USES TREATMENT TO ENHANCE HYDROPHILICITY OF SPIN COATED INSULATING FILM

CROSS-REFERENCE TO RELATED APPLICATIONS

The disclosure of Japanese Patent Application No. 2015-039120 filed on Feb. 27, 2015 including the specification, drawings, and abstract is incorporated herein by reference in its entirety.

BACKGROUND

The present invention relates to a method of manufacturing a semiconductor device, for example, a technology suited for use in a method of manufacturing a semiconductor device having an interlayer insulating film.

A semiconductor device is manufactured by forming semiconductor elements such as MISFET on the main surface of a semiconductor substrate and then forming, on the main surface of the semiconductor substrate, a multilayer wiring structure comprised of a plurality of interlayer insulating films and a plurality of wiring layers.

Japanese Unexamined Patent Application Publication No. Hei 9(1997)-241518 (Patent Document 1) describes a technology of forming an insulating film by spin coating.

Japanese Unexamined Patent Application Publication No. Hei 9(1997)-161330 (Patent Document 2) describes a technology of applying a protective coating material to a surface by spraying and then, planarizing the applied surface by ultrasonic oscillation.

Japanese Unexamined Patent Application Publication No. Hei 8(1996)-330306 (Patent Document 3) describes a technology of planarizing the upper surface of a SOG film by a CMP treatment.

PATENT DOCUMENTS

[Patent Document 1] Japanese Unexamined Patent Application Publication No. Hei 9(1997)-241518
[Patent Document 2] Japanese Unexamined Patent Application Publication No. Hei 9(1997)-161330
[Patent Document 3] Japanese Unexamined Patent Application Publication No. Hei 8(1996)-330306

SUMMARY

Even a semiconductor device having an interlayer insulating film is desired to have reliability as improved as possible, desired to be manufactured at a minimized cost, or desired to satisfy both improvement in reliability and reduction in manufacturing cost.

Another object and novel features will be apparent from the description herein and accompanying drawings.

In one embodiment, there is provided a method of manufacturing a semiconductor device having, on a semiconductor substrate thereof, a first interlayer insulating film. Steps for forming the first interlayer insulating film includes (a) forming a first insulating film for the first interlayer insulating film by spin coating, (b) carrying out a first treatment for improving hydrophilicity of surface of the insulating film, and (c) after the step (b), forming, on the first insulating film, a second insulating film for the first interlayer insulating film by spin coating.

According to the one embodiment, a semiconductor device having improved reliability can be provided.

A semiconductor device can be manufactured at a reduced cost.

Or, a semiconductor device can have improved reliability and at the same time, can be manufactured at a reduced cost.

DETAILED DESCRIPTION

Figure 1:
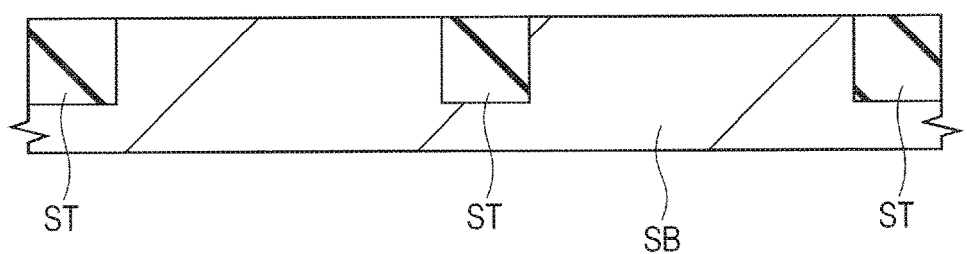
FIG. 1 is a fragmentary cross-sectional view of a semiconductor device of First Embodiment during a manufacturing step thereof.

In the following embodiments, a description may be made after divided in a plurality of sections or embodiments if necessary for the sake of convenience. These sections or embodiments are not independent from each other unless otherwise particularly specified, but one of them may be a modification example, details, complementary description, or the like of a part or whole of the other one. In the following embodiments, when a reference is made to the number (including the number, value, amount, range, or the like) of a component, the number is not limited to a specific number but may be more or less than the specific number, unless otherwise particularly specified or principally apparent that the number is limited to the specific number. Further, in the following embodiments, it is needless to say that the constituent component (including component step or the like) is not always essential unless otherwise particularly specified or principally apparent that it is essential. Similarly, in the following embodiments, when a reference is made to the shape, positional relationship, or the like of the constituent component, that substantially approximate or analogous to it is also embraced unless otherwise particularly specified or principally apparent that it is not. This also applies to the above-mentioned value, range, or the like.

Embodiments will hereinafter be described in detail based on drawings. In all the drawings for describing the embodiment, members having the same function will be identified by the same reference numerals and overlapping descriptions will be omitted. In the following embodiments, a description on the same or similar portion is not repeated in principle unless otherwise particularly necessary.

In the drawings to be used in the following embodiment, even a cross-sectional view is sometimes not hatched to make it easier to understand. On the other hand, even a plan view is sometimes hatched to make it easier to understand.

First Embodiment

Manufacturing Steps of Semiconductor Device

Manufacturing steps of the semiconductor device of the present embodiment will be described referring to drawings. FIGS. 1 to 15 are fragmentary cross-sectional views of the semiconductor device of the present embodiment during manufacturing steps thereof.

First, as shown in FIG. 1, a semiconductor substrate (semiconductor wafer) SB comprised of, for example, p type single crystal silicon having specific resistance of from about 1 to 10 Ωcm or the like is provided (prepared).

Next, semiconductor elements such as MISFET (metal insulator semiconductor field effect transistor) are formed on the main surface of the semiconductor substrate SB. Steps of forming the MISFET will hereinafter be described briefly.

First, as shown in FIG. 1, an element isolation region ST is formed in the semiconductor substrate SB. The element isolation region ST can be formed using STI (shallow trench isolation), LOCOS (local oxidation of silicon), or the like.

Figure 2:
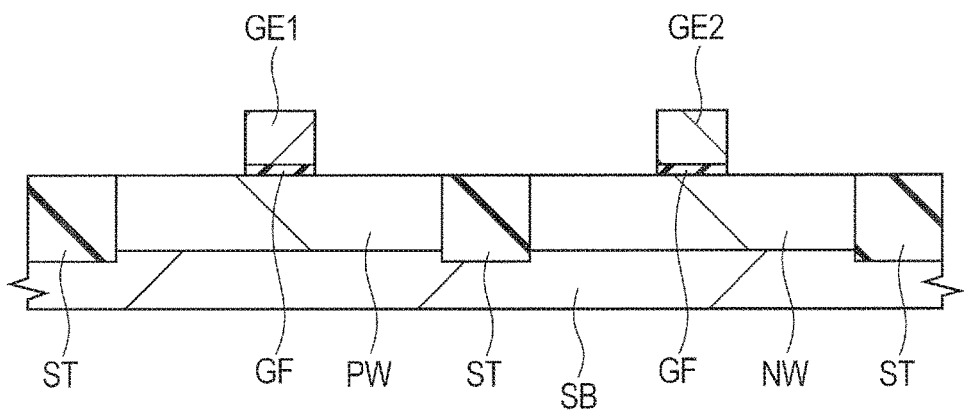
FIG. 2 is a fragmentary cross-sectional view of the semiconductor device during a manufacturing step following that of FIG. 1.

As shown in FIG. 2, a p well PW and an n well NW are formed in the semiconductor substrate SB, each by ion implantation or the like. A gate electrode GE1 for n channel MISFET10 is formed on the p well PW via a gate insulating film GF and a gate electrode GE2 for p channel MISFET11 is formed on the n well NW via another gate insulating film GF. The gate electrodes GE1 and GE2 and the gate insulating film GF can be formed, for example, by forming an insulating film (for example, a silicon oxide film) for gate insulating film GF and conductive films (for example, doped polysilicon films) for the gate electrodes GE1 and GE2 on the main surface of the semiconductor substrate SB successively and then patterning the conductive films.

Figure 3:
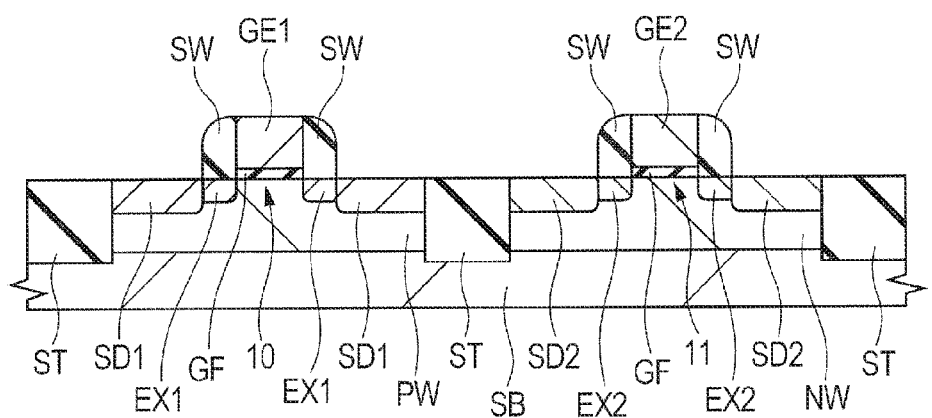
FIG. 3 is a fragmentary cross-sectional view of the semiconductor device during a manufacturing step following that of FIG. 2.

As shown in FIG. 3, with the gate electrode GE1 as a mask, an n type impurity is then ion-implanted into the p well PW to form an n⁻ type semiconductor region EX1 on both sides of the Grate electrode GE1 in the p well PW. In addition, with the gate electrode GE2 as a mask, a p type impurity is ion-implanted into the n well NW to form a p⁻ type semiconductor region EX2 on both sides of the gate electrode GE2 in the n well NW.

After formation of an insulating film for the formation of a sidewall spacer SW is formed so as to cover the gate electrodes GE1 and GE2, the insulating film is anisotropically etched to form a sidewall spacer (sidewall insulating film) SW on the side walls of each of the gate electrodes GE1 and GE2.

With the gate electrode GE1 and the sidewall spacer SW on the side wall thereof as a mask, an n type impurity is ion-implanted into the p well PW to form, in the p well PW, an n⁺ type semiconductor region SD1 having an impurity concentration higher than that of the n⁻ type semiconductor region EX1 on both sides of a structure comprised of the gate electrode GE1 and the sidewall spacer SW on the side wall thereof. Then, with the gate electrode GE2 and the sidewall spacer SW on the side wall thereof as a mask, a p type impurity is ion-implanted into the n well NW to form, in the n well NW, a p⁺ type semiconductor region SD2 having an impurity concentration higher than that of the p⁻ type semiconductor region EX2 on both sides of a structure comprised of the gate electrode GE2 and the sidewall spacer SW on the side wall thereof. A source-drain region of the n channel MISFET10 having an LDD structure is formed by the n⁻ type semiconductor region EX1 and the n⁺ type semiconductor region SD1, while a source-drain region of the p channel MISFET11 having an LDD structure is formed by the p⁻ type semiconductor region EX2 and the p⁺ type semiconductor region SD2. As the heat treatment for activating the impurities so far introduced, activation annealing is then performed. Metal silicide layers (not shown) may be formed on the surfaces (surface layer portions) of the gate electrodes GE1 and GE2, the n⁺ type semiconductor region SD1, and the p⁺ type semiconductor region SD2, respectively, by salicide (self aligned silicide) technology or the like.

As shown in FIG. 3, the n channel MISFET10 and the p channel MISFET11 can be formed on the semiconductor substrate SB. The semiconductor elements formed on the semiconductor substrate SB are not limited to the n channel MISFET10 and the p channel MISFET11, but various semiconductor elements can be formed on the semiconductor substrate SB. For example, capacitive elements, resistive elements, memory elements, and transistors having another configuration can be formed on the main surface of the semiconductor substrate SB.

Next, a multilayer wiring structure comprised of a plurality of interlayer insulating films (IL1 to IL5) and a plurality of wiring layers (M1 to M5) is formed on the semiconductor substrate SB, which will hereinafter be described specifically.

Figure 4:
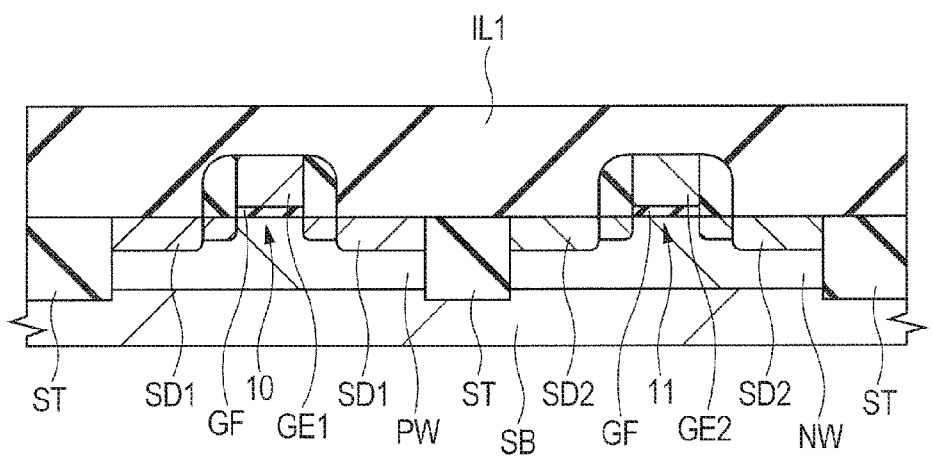
FIG. 4 is a fragmentary cross-sectional view of the semiconductor device during a manufacturing step following that of FIG. 3.

First, as shown in FIG. 4, an interlayer insulating film IL1 is formed on the main surface (entire main surface) of the semiconductor substrate SB. The interlayer insulating film IL1 is formed so as to cover the elements (here, MISFET10 and 11) formed on the semiconductor substrate SB. This interlayer insulating film IL1 is formed on the entire main surface of the semiconductor substrate SB so as to cover the gate electrodes GE1 and GE2 and the sidewall spacer SW.

Figure 5:
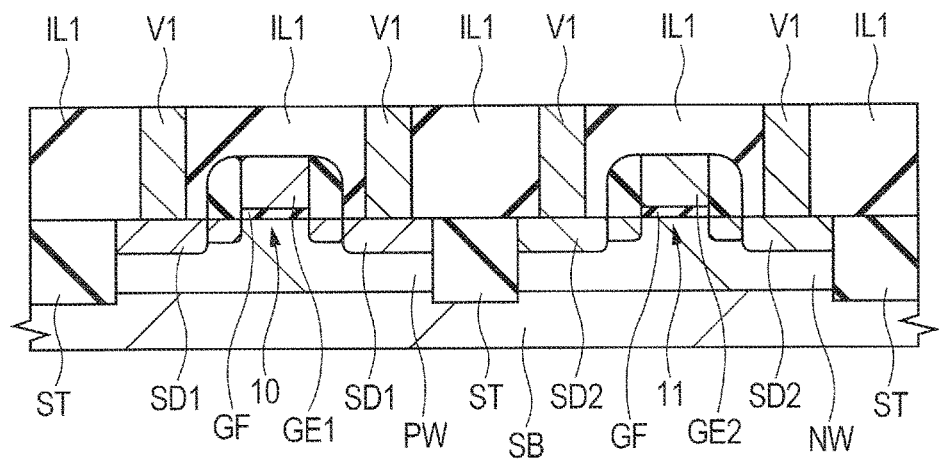
FIG. 5 is a fragmentary cross-sectional view of the semiconductor device during a manufacturing step following that of FIG. 4.

Next, as shown in FIG. 5, with a photoresist pattern (not shown) formed on the interlayer insulating film IL1 by photolithography as an etching mask, the interlayer insulating film IL1 is dry etched to form, in the interlayer insulating film IL1, a contact hole (through-hole, hole) to be filled with a via portion V1. This contact hole is formed to penetrate through the interlayer insulating film IL1. The contact hole is then filled with a conductive film to form the via portion (plug) V1 in the contact hole. The via portion V1 can also be regarded as a conductive plug.

The via portion V1 is formed, for example, by forming a barrier conductor film (for example, a titanium film, a titanium nitride film, or a stacked film thereof) on the interlayer insulating film IL1 including the inside (on the bottom portion and side wall) of the contact hole by sputtering, plasma CVD, or the like method. A main conductor film made of a tungsten film or the like is formed on the barrier conductor film by CVD or the like so as to fill the contact hole. An unnecessary portion of the main conductor film and the barrier conductor film outside (on the interlayer insulating film IL1) of the contact hole is removed by CMP (chemical mechanical polishing) or etchback. By this removal, the upper surface of the interlayer insulating film IL1 is exposed and the via portion V1 comprised of the barrier conductor film and the main conductor film which have been buried and remained in the contact hole in the interlayer insulating film IL1 is formed. FIG. 5 shows the main conductor film and the barrier conductor film of the via portion V1 as one film to simplify the drawing.

Figure 6:
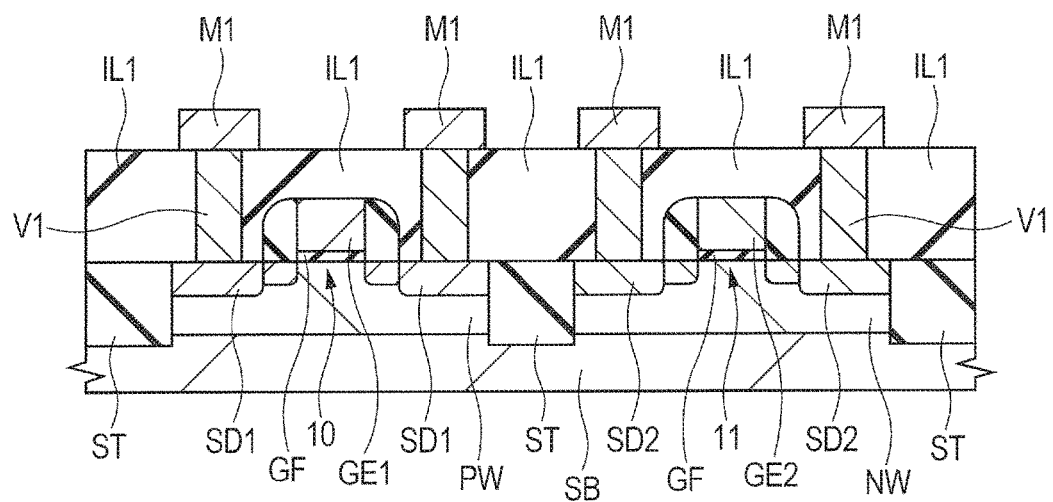
FIG. 6 is a fragmentary cross-sectional view of the semiconductor device during a manufacturing step following that of FIG. 5.

Next, as shown in FIG. 6, a wiring M1 of a first wiring layer which is a lowermost wiring layer is formed on the interlayer insulating film IL1 filled with the via portion V1. In forming the wiring M1, first, a conductive film for first wiring layer is formed on the interlayer insulating film IL1 filled with the via portion V1. This conductive film is comprised of, for example, a film obtained by stacking a barrier conductor film, an aluminum film, and another barrier conductor film one after another in order of mention and it can be formed using sputtering or the like. Examples of the barrier conductor film used as the conductive film for first wiring layer include a titanium film, a titanium nitride film, and a stacked film thereof. This will also apply to the barrier conductor film of each conductive film for second to fifth wiring layers to be formed later. The aluminum film used as the conductive film for first wiring layer is not limited to a pure aluminum film and a conductive material film (however, a conductive material film showing metal conduction) having aluminum as a main component can be used. This will also apply to the aluminum film of the conductive films for the second to fifth wiring layers to be formed later. The conductive films for the first wiring layer are then patterned using photolithography and etching to form the wiring M1. The wiring M1 is preferably an aluminum wiring. The via portion V1 is contiguous, at the upper surface thereof, to the wiring M1 so that it is electrically coupled to the wiring M1.

Figure 7:
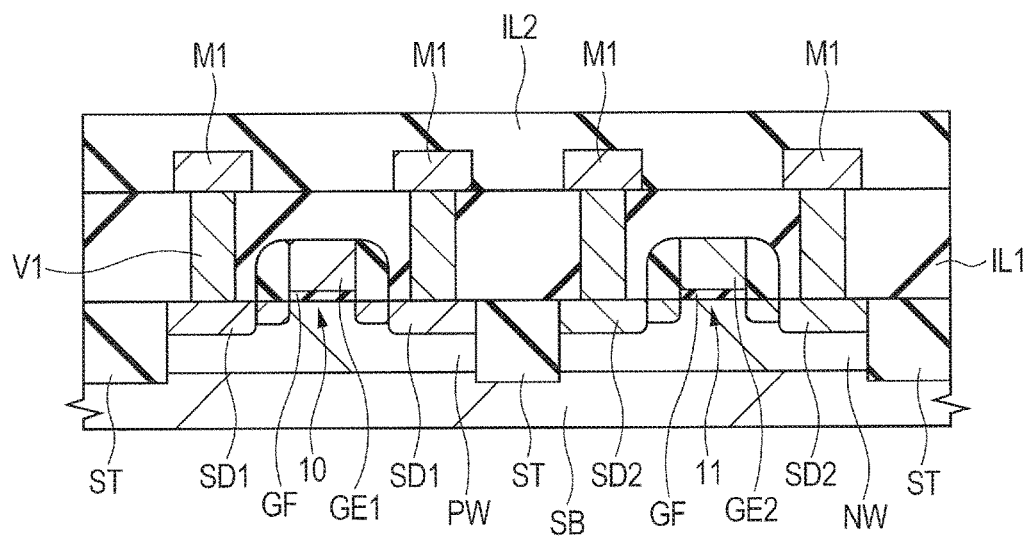
FIG. 7 is a fragmentary cross-sectional view of the semiconductor device during a manufacturing step following that of FIG. 6.

Next, as shown in FIG. 7, an interlayer insulating film IL2 is formed on the main surface (entire main surface) of the semiconductor substrate SB, that is, on the interlayer insulating film IL1 so as to cover the wiring M1.

Figure 8:
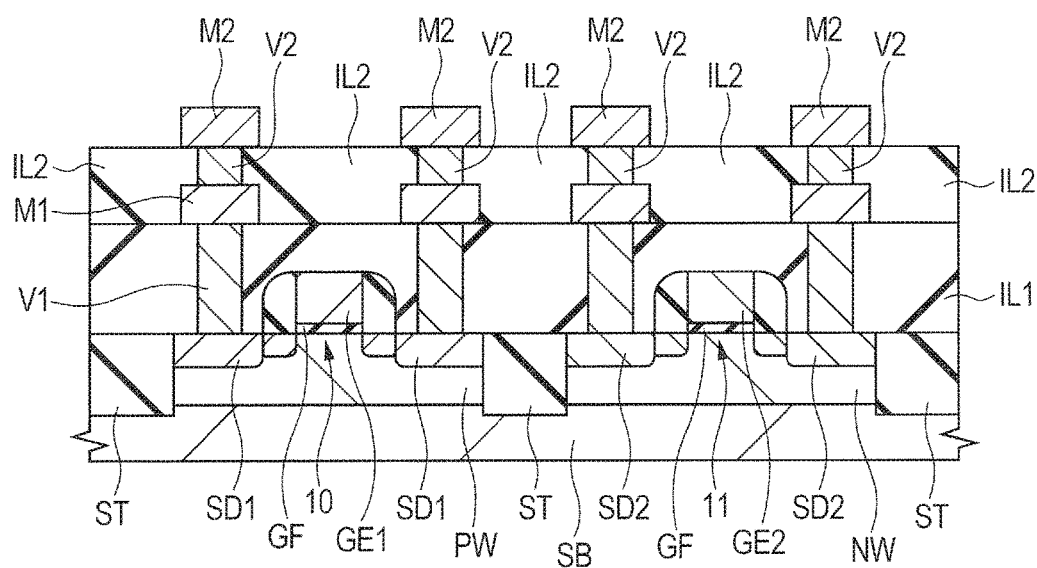
FIG. 8 is a fragmentary cross-sectional view of the semiconductor device during a manufacturing step following that of FIG. V.

Next, as shown in FIG. 8, with a photoresist pattern (not shown) formed on the interlayer insulating film IL2 by photolithography as an etching mask, the interlayer insulating film IL2 is dry etched to form, in the interlayer insulating film IL2, a through-hole (hole) to be filled with a via portion V2. The through-hole is then filled with a conductive film to form the via portion V2 in the through-hole. The via portion V2 can also be regarded as a conductive plug.

The via portion V2 can be formed in a manner similar to that of the via portion V1. The via portion V2 and the via portion V1 can be formed using the same conductive film material, but may be formed using respectively different materials. For example, a tungsten film may be used mainly for the via portion V1 and an aluminum film may be used mainly for the via portion V2.

Next, a wiring M2 of a second wiring layer is formed on the interlayer insulating film IL2 having therein the via portion V2. The wiring M2 is formed in the following manner. First, a conductive film for second wiring layer is formed on the interlayer insulating film IL2 having therein the via portion V2. This conductive film is comprised of a film obtained by stacking a barrier conductor film, an aluminum film, and another barrier conductive film one after another in order of mention and it can be formed using sputtering or the like. This conductive film for second wiring layer is then patterned using photolithography and etching to form a wiring M2. The wiring M2 is preferably an aluminum wiring. The via portion V2 is contiguous, at the lower surface thereof, to the wiring M1 and is therefore electrically coupled to the wiring M1, while it is contiguous, at the upper surface thereof, to the wiring M2 and is therefore electrically coupled to the wiring M2. This means that the via portion V2 electrically couples the wiring M1 to the wiring M2.

The via portion V2 and the wiring M2 described above are formed in respectively different steps. As another mode, the via portion V2 and the wiring M2 may be formed by the same step. In this case, the via portion V2 and the wiring M2 are formed as one body. In this case, the wiring M2 is formed by forming a through-hole for the via portion V2 in the interlayer insulating film IL2, forming a conductive film for second wiring layer on the interlayer insulating film IL2 so as to fill this through-hole, and then patterning the resulting conductive film by photolithography and etching. As a result, the wiring M2 is formed and at the same time, the via portion V2 integrated with the wiring M2 is formed.

Figure 9:
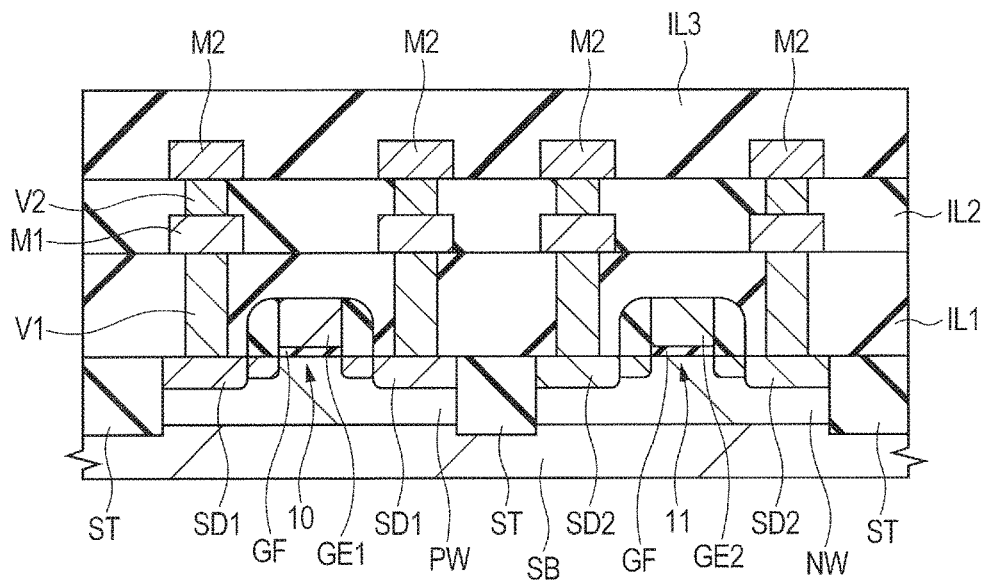
FIG. 9 is a fragmentary cross-sectional view of the semiconductor device during a manufacturing step following that of FIG. 8.

Next, as shown in FIG. 9, an interlayer insulating film IL3 is formed on the main surface (entire main surface) of the semiconductor substrate SB, that is, on the interlayer insulating film IL2 so as to cover the wiring M2.

Figure 10:
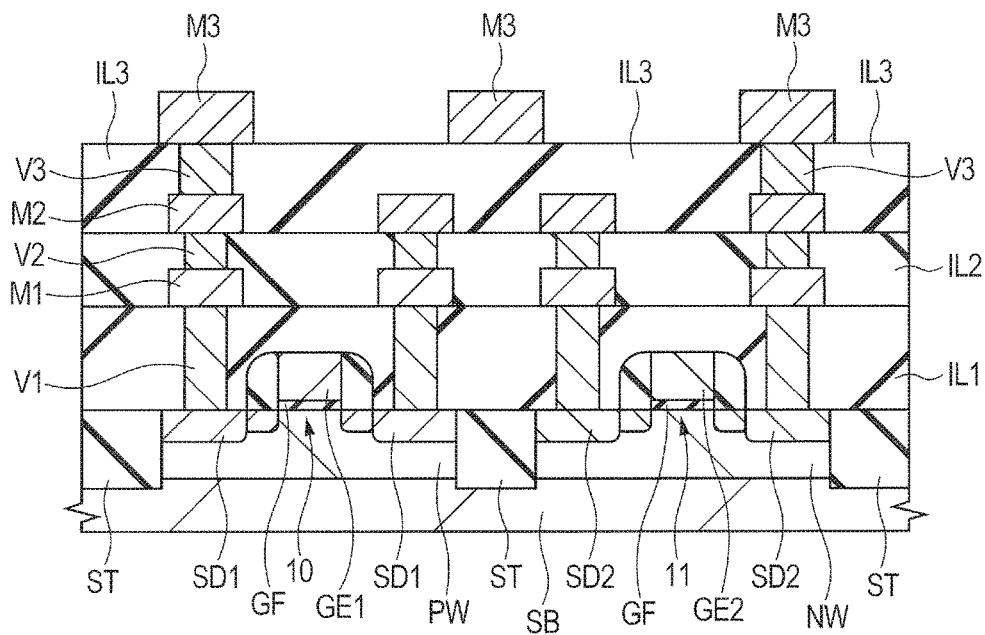
FIG. 10 is a fragmentary cross-sectional view of the semiconductor device during a manufacturing step following that of FIG. 9.

Next, as shown in FIG. 10, a through-hole (hole) to be filled with a via portion V3 is formed in the interlayer insulating film IL3 by dry etching the interlayer insulating film IL3 with a photoresist pattern (not shown) formed on the interlayer insulating film IL3 by photolithography as an etching mask. The through-hole is then filled with a conductive film to form the via portion V3 in the through-hole. The via portion V3 can be formed using the conductive material and the method as those used for the formation of the via portion V2. The via portion V3 can also be regarded as a conductive plug.

Next, a wiring M3 for third wiring layer is formed on the interlayer insulating film IL3 filled with the via portion V3. The wiring M3 is formed in the following manner. First, a conductive film for third wiring layer is formed on the interlayer insulating film IL3 filled with the via portion V3. This conductive film is comprised of, for example, a film obtained by stacking a barrier conductor film, an aluminum film, and another conductive film one after another in order of mention and it can be formed by sputtering or the like. Then, the conductive film for third wiring layer is patterned using photolithography and etching to form the wiring M3. The wiring M3 is preferably an aluminum wiring. The via portion V3 is contiguous, at the lower surface thereof, to the wiring M2 and thereby electrically coupled to the wiring M2, while it is contiguous, at the upper surface, to the wiring M3 and thereby electrically coupled to the wiring M3. This means that the via portion V3 electrically couples the wiring M2 to the wiring M3.

In the above description, the via portion V3 and the wiring M3 are formed by respectively different steps. In another mode, the via portion V3 and the wiring M3 can be formed by the same step. In this case, the via portion V3 and the wiring M3 are formed as one body.

Figure 11:
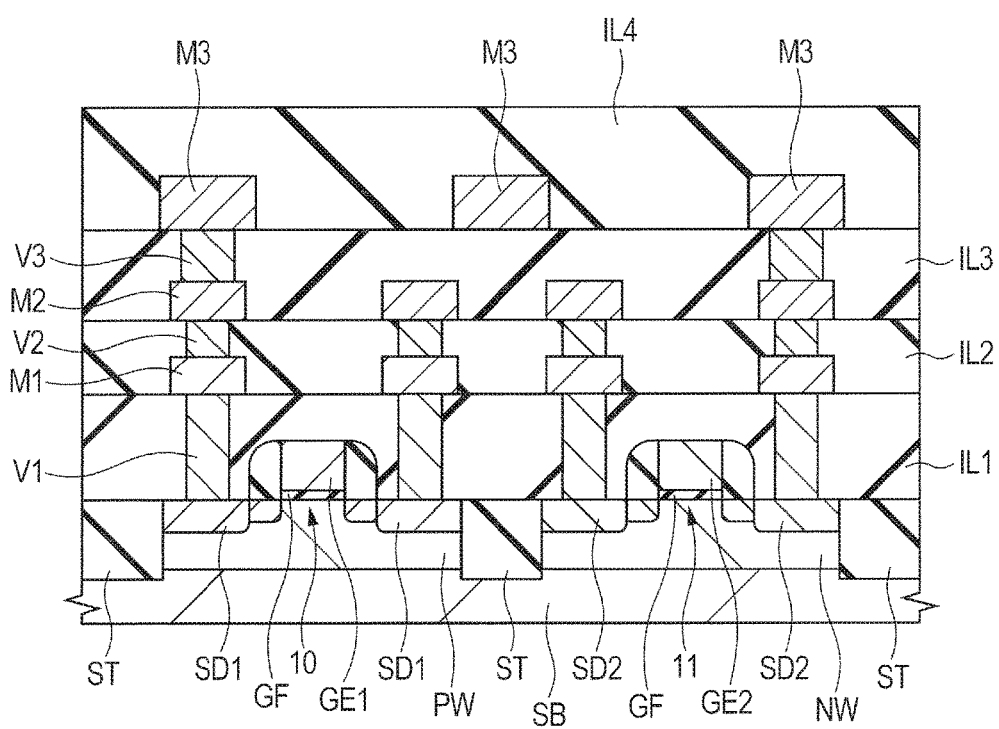
FIG. 11 is a fragmentary cross-sectional view of the semiconductor device during a manufacturing step following that of FIG. 10.

Next, as shown in FIG. 11, an interlayer insulating film IL4 is formed on the main surface (entire main surface) of the semiconductor substrate SB, that is, on the interlayer insulating film IL3 so as to cover the wiring M3.

Figure 12:
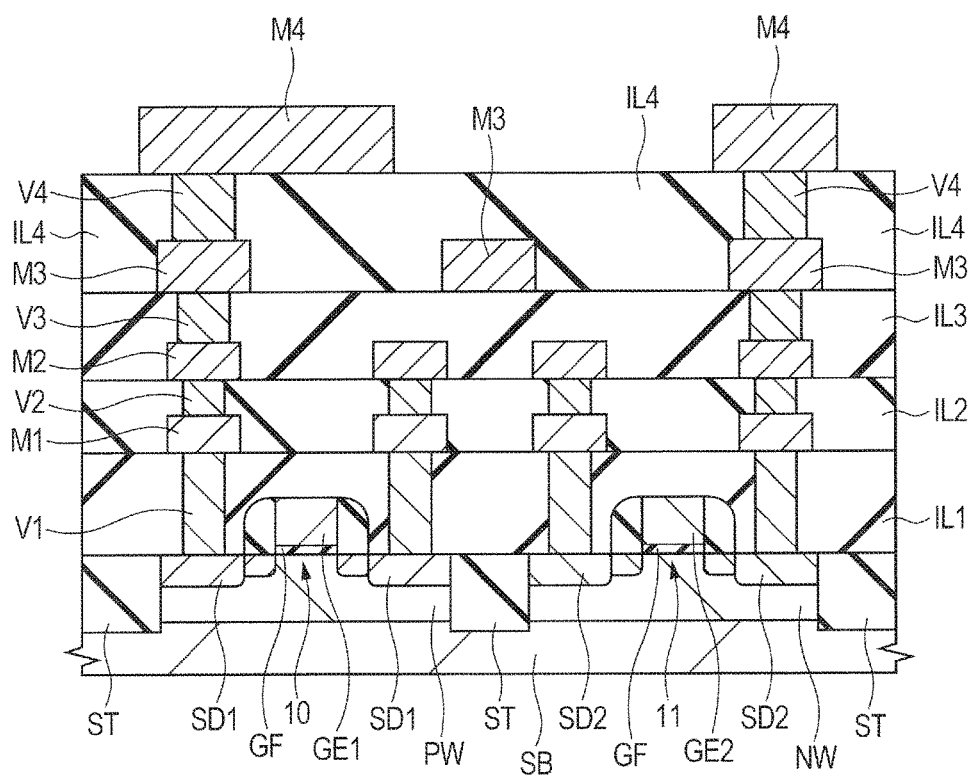
FIG. 12 is a fragmentary cross-sectional view of the semiconductor device during a manufacturing step following that of FIG. 11.

Next, as shown in FIG. 12, the interlayer insulating film IL4 is dry etched with a photoresist pattern (not shown) formed on the interlayer insulating film IL4 by photolithography as an etching mask to form, in the interlayer insulating film IL4, a through-hole (hole) to be filled with a via portion V4. The resulting through-hole is then filled with a conductive film to form the via portion V4 in the through-hole. The via portion V4 can be formed using the same conductive material and the same method as those used for the formation of the via portion V3. The via portion V4 can also be regarded as a conductive plug.

Next, a wiring M4 of a fourth wiring layer is formed on the interlayer insulating film IL4 filled with the via portion V4. The wiring M4 is formed in the following manner. First, a conductive film for fourth wiring layer is formed on the interlayer insulating film IL4 filled with the via portion V4. This conductive film is made of a film obtained by stacking a barrier conductor film, an aluminum film, and another barrier conductive film one after another in order of mention and can be formed using sputtering or the like. The conductive film for fourth wiring layer is then patterned using photolithography and etching to form the wiring M4. The wiring M4 is preferably an aluminum wiring. The via portion V4 is contiguous, at the lower surface thereof, to the wiring M3 and is thereby electrically coupled to the wiring M3, while it is contiguous, at the upper surface thereof, to the wiring M4 and is thereby electrically coupled to the wiring M4. This means that the via portion V4 electrically couples the wiring M3 to the wiring M4.

In the above description, the via portion V4 and the wiring M4 are formed in respectively different steps. As another mode, the via portion V4 and the wiring M4 may be formed by the same step. In this case, the via portion V4 and the wiring M4 are formed as one body.

Figure 13:
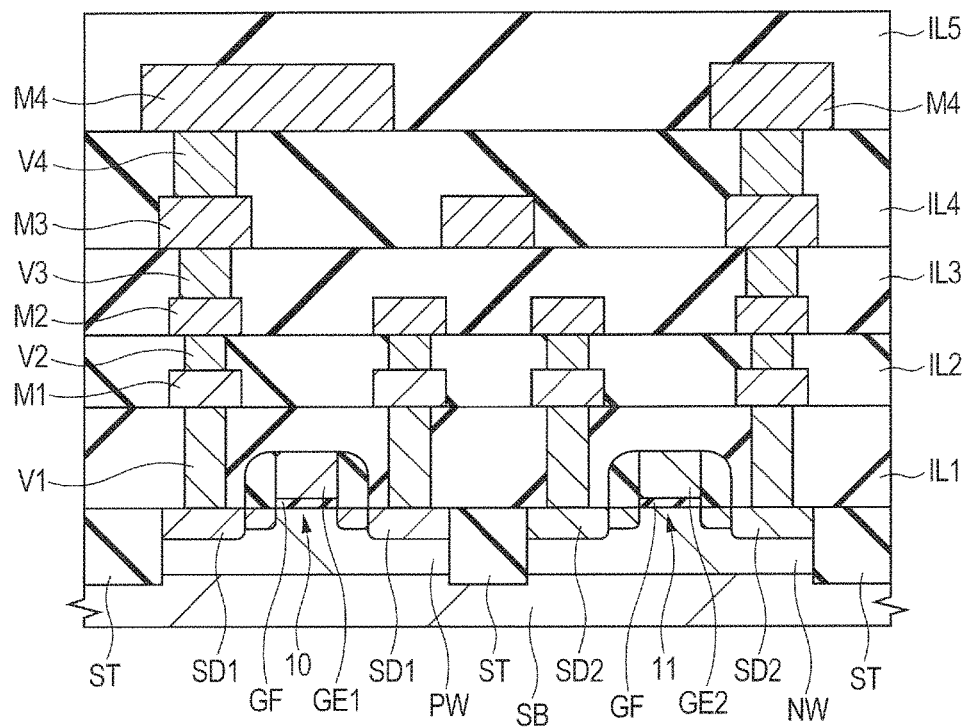
FIG. 13 is a fragmentary cross-sectional view of the semiconductor device during a manufacturing step following that of FIG. 12.

Next, as shown in FIG. 13, an interlayer insulating film IL5 is formed on the main surface (entire main surface) of the semiconductor substrate SB, that is, on the interlayer insulating film IL4 so as to cover the wiring M4.

Figure 14:
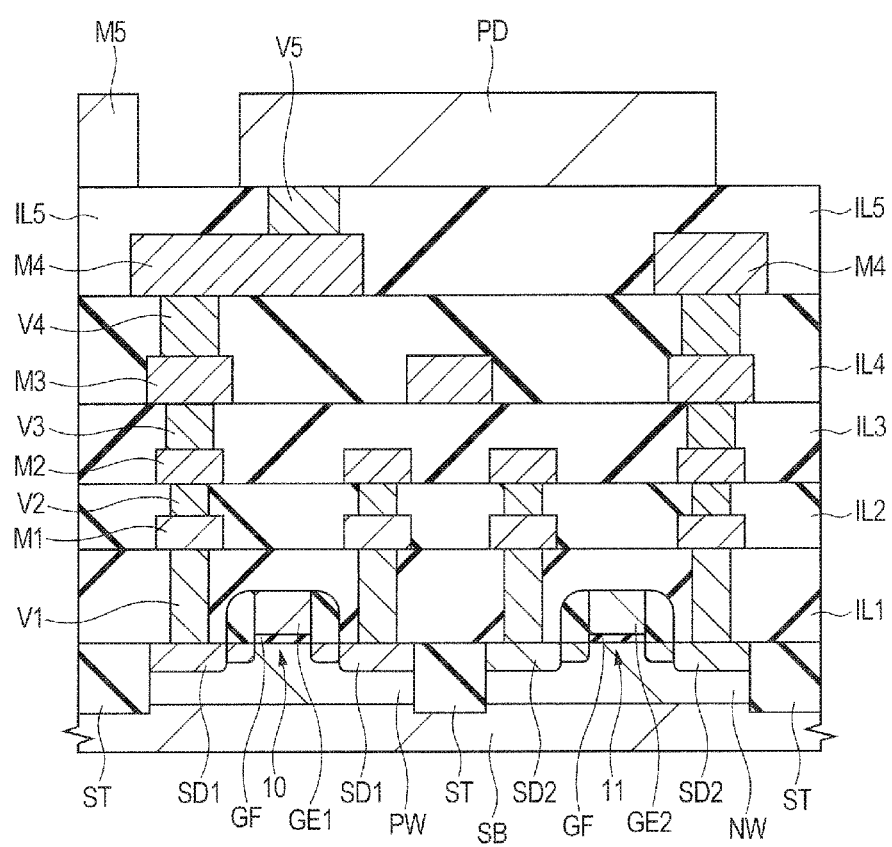
FIG. 14 is a fragmentary cross-sectional view of the semiconductor device during a manufacturing step following that of FIG. 13.

Next, as shown in FIG. 14, the interlayer insulating film IL5 is dry etched with a photoresist pattern (not shown) formed on the interlayer insulating film IL5 by photolithography as an etching mask to form, in the interlayer insulating film IL5, a through-hole (hole) to be filled with a via portion V5. The through-hole is then filled with a conductive film to form the via portion V5 in the through-hole. The via portion V5 can be formed using the same conductive material and the same method as those used for the formation of the via portion V4. The via portion V5 can also be regarded as a conductive plug.

A wiring M5 and a pad PD for fifth wiring layer are formed on the interlayer insulating film IL5 filled with the via portion V5. The wiring M5 and the pad PD are formed in the following manner. First, a conductive film for fifth wiring layer is formed on the interlayer insulating film IL5 filled with the via portion V5. This conductive film is, for example, a film obtained by stacking a barrier conductor film, an aluminum film, and another barrier conductor film one after another in order of mention and it can be formed using sputtering or the like. The conductive film for fifth wiring layer is then patterned using photolithography and etching to form the wiring M5 and the pad PD. The wiring M5 is preferably an aluminum wiring and the pad PD is preferably an aluminum pad. The via portion V5 is contiguous, at the lower surface thereof, to the wiring M4 and is thereby electrically coupled to the wiring M4, while it is contiguous, at the upper surface thereof, to the wiring M5 or the pad PD and is thereby electrically coupled to the wiring M5 or the pad PD. This means that the via portion V5 electrically couples the wiring M4 to the wiring M5 or electrically couples the wiring M4 to the pad PD. The pad PD can have, for example, a substantially rectangular planar shape with a side larger than the wiring width of the wiring M5.

In the above description, the via portion V5 and the wiring M5 are formed by respectively different steps. In another mode, the via portion V5 and the wiring M5 can be formed in one step. In this case, the via portion V5 and the wiring M5 or the pad PD are formed as one body. In this case, the wiring M5 and the pad PD are formed by forming a through-hole in the interlayer insulating film IL5, forming a conductive film for fifth wiring layer on the interlayer insulating film IL5 so as to fill the through-hole, and then patterning the conductive film by photolithography and etching. As a result, the wiring M5 and the pad PD are formed and at the same time, the via portion V5 and the wiring M5 or the pad PD are integrally formed.

In the above description, the pad PD and the wiring M5 are formed in the same layer. There may also be a mode in which the pad PD and the wiring are not formed in the same layer.

Figure 15:
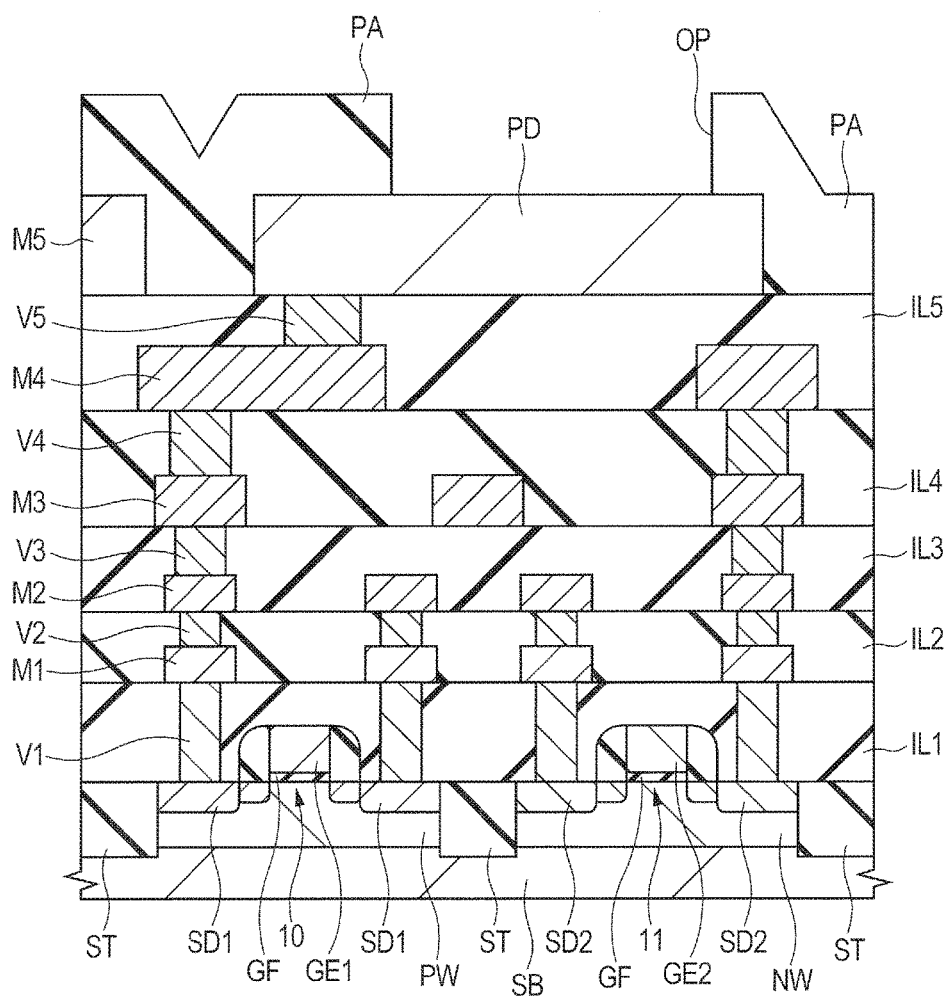
FIG. 15 is a fragmentary cross-sectional view of the semiconductor device during a manufacturing step following that of FIG. 14.

Next, as shown in FIG. 15, an insulating film (protective film, protective insulating film) PA is formed on the main surface (entire main surface) of the semiconductor substrate SB, that is, on the interlayer insulating film IL5 is formed so as to cover the wiring M5 and the pad PD.

As the insulating film PA, a monolayer insulating film or a stacked insulating film obtained by stacking a plurality of insulating films can be used. For example, a silicon oxide film, a silicon nitride film, or a stacked film thereof (for example, a stacked film of a silicon oxide film and a silicon nitride film on the silicon oxide film) can be used as the insulating film PA. Alternatively, a resin film (organic insulating film) made of a polyimide resin or the like can also be used as the insulating film PA.

Next, an opening portion OP is formed in the insulating film PA. The opening portion OP is formed by selectively removing the insulating film PA on the pad PD. The opening portion P is formed to be included in the pad PD in plan view. From the opening portion OP of the insulating film PA, the surface of the pad PD is exposed. The wiring M5 is not exposed even if the opening portion OP is formed because it is still covered with the insulating film PA.

The opening portion OP can be formed, for example, in the following manner. After formation of the insulating film PA, a photoresist pattern (not shown) is formed on the insulating film PA by photolithography. Then, with the photoresist pattern as an etching mask, the insulating film PA is etched (dry etched) to form the opening portion OP in the insulating film PA. When the insulating film PA is made of a photosensitive resin, the insulating film PA made of the photosensitive resin is exposed and developed to form the opening portion OP in the insulating film PA. Further, the pad PAD exposed from the opening portion OP may be plated.

A dicing step is then performed to cut (dice) the semiconductor substrate SB and it is divided (individualized) into a plurality of semiconductor chips. In such a manner, a semiconductor device can be manufactured.

<Interlayer Insulating Film Formation Steps>

Figure 16:
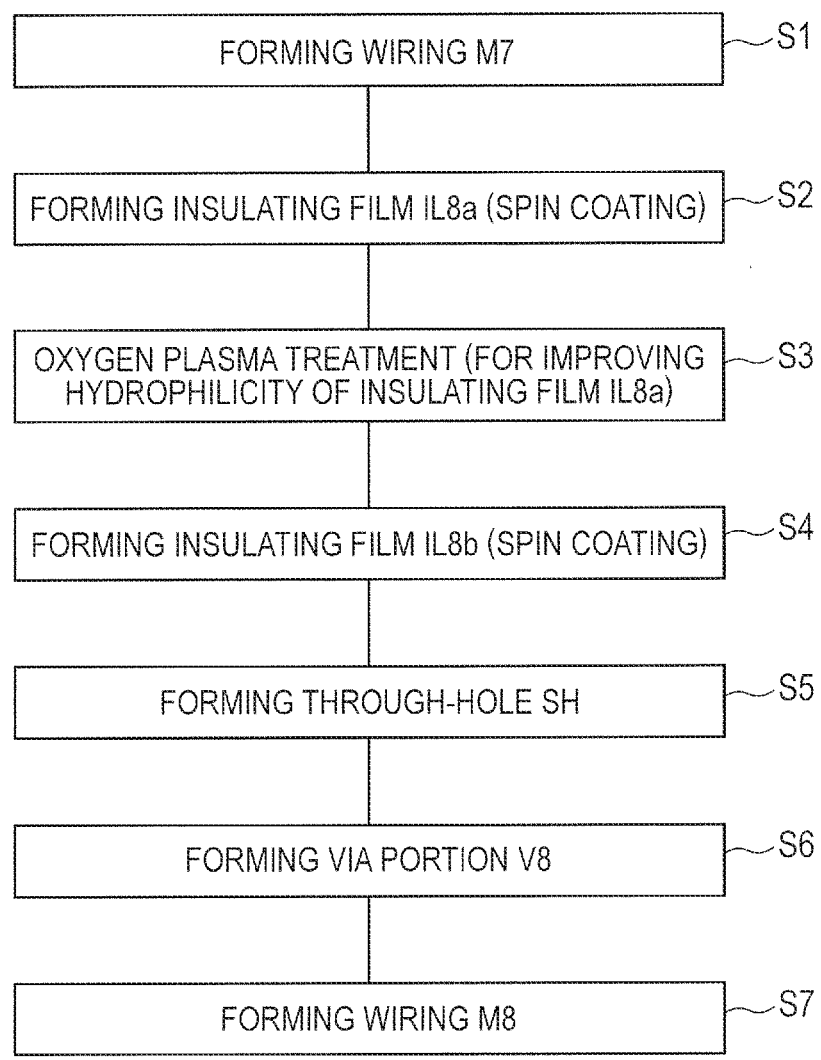
FIG. 16 is a process flow chart showing some of the manufacturing steps of the semiconductor device according to First Embodiment.

Next, steps of forming interlayer insulating films of the present embodiment will be described referring to FIGS. 16 to 27. FIG. 16 is a process flow chart showing some of the manufacturing steps of the semiconductor device of the present embodiment. FIGS. 17 to 27 are fragmentary cross-sectional views of the semiconductor device of the present embodiment during manufacturing steps. FIGS. 17 to 27 do not include a structure below the interlayer insulating film IL7.

A wiring M7 corresponds to any of the wirings M1, M2, M3, and M4. This means that when the wiring M7 corresponds to the wiring M1, an interlayer insulating film IL7 corresponds to the interlayer insulating film ILL an interlayer insulating film IL8 corresponds to the interlayer insulating film IL2, a via portion V8 corresponds to the via portion V2, and a wiring M8 corresponds to the wiring M2. When the wiring M7 corresponds to the wiring M2, the interlayer insulating film IL7 corresponds to the interlayer insulating film IL2, the interlayer insulating film IL8 corresponds to the interlayer insulating film IL3, the via portion V8 corresponds to the via portion V3, and the wiring M8 corresponds to the wiring M3. When the wiring M7 corresponds to the wiring M3, the interlayer insulating film IL7 corresponds to the interlayer insulating film IL3, the interlayer insulating film IL8 corresponds to the interlayer insulating film IL4, the via portion V8 corresponds to the via portion V4, and the wiring M8 corresponds to the wiring M4. When the wiring M7 corresponds to the wiring M4, the interlayer insulating film IL7 corresponds to the interlayer insulating film IL4, the interlayer insulating film IL8 corresponds to the interlayer insulating film IL5, the via portion V8 corresponds to the via portion V5, and the wiring M8 corresponds to the wiring M5 or the pad PD.

Figure 17:
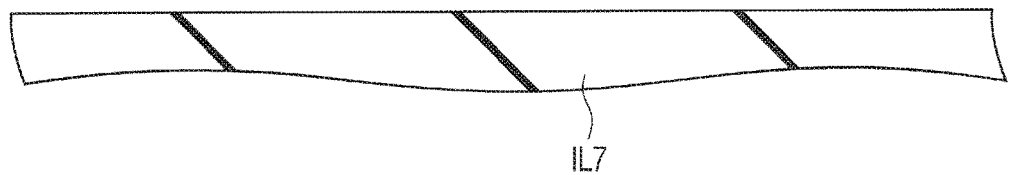
FIG. 17 is a fragmentary cross-sectional view of the semiconductor device of First Embodiment during a manufacturing step thereof.

FIG. 17 shows a stage immediately before formation of the wiring M7 on the interlayer insulating film IL7. Although the interlayer insulating film IL7 is filled with a via portion (corresponding to any of the via portions V1, V2, V3, and V4), the via portion buried in the interlayer insulating film IL7 is omitted from the drawing.

The wiring M7 is formed on the interlayer insulating film IL7 (Step S1 of FIG. 16). Specifically, the wiring M7 can be formed as follows (FIG. 18 and FIG. 19).

Figure 18:
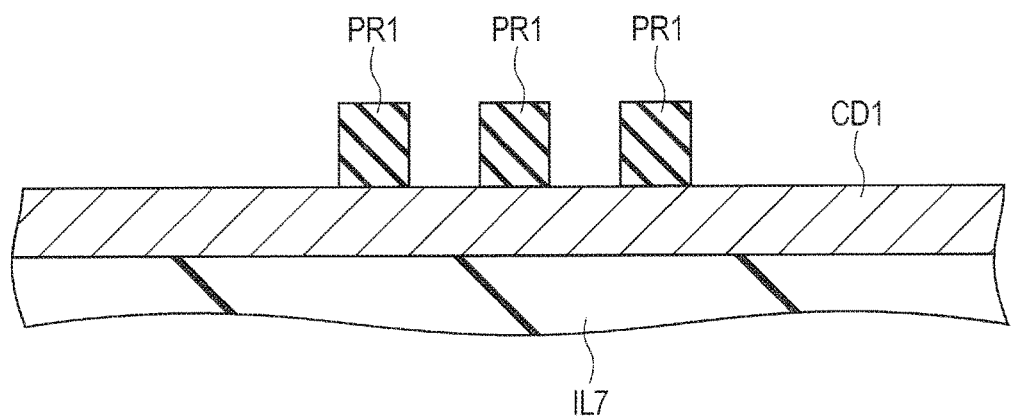
FIG. 18 is a fragmentary cross-sectional view of the semiconductor device during a manufacturing step following that of FIG. 17.
Figure 19:
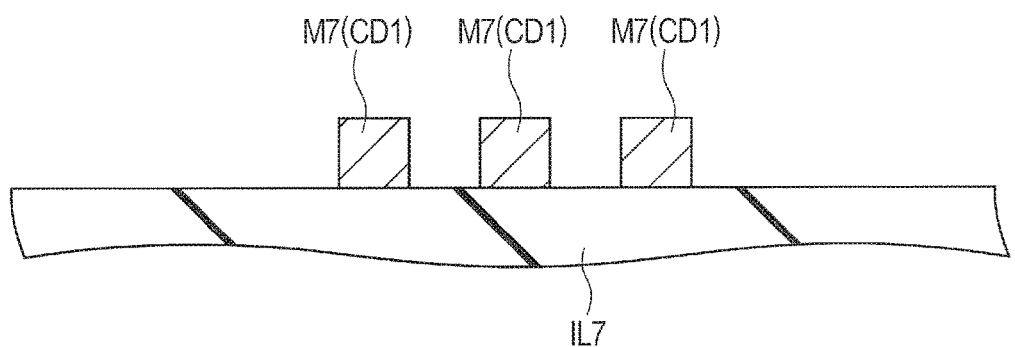
FIG. 19 is a fragmentary cross-sectional view of the semiconductor device during a manufacturing step following that of FIG. 18.

Described specifically, as shown in FIG. 18, a conductive film (metal film) CD1 for the formation of the wiring M7 is formed on the interlayer insulating film IL7. The conductive film CD1 is comprised of, for example, a film obtained by stacking a barrier conductor film, an aluminum film, and a barrier conductor film one after another in order of mention and it can be formed using sputtering or the like. A photoresist pattern PR1 is then formed on the conductive film CD1 by photolithography. With the photoresist pattern PR1 as an etching mask, the conductive film CD1 is then etched (dry etched). By this etching, the conductive film CD1 is patterned and the wiring M7 comprised of the patterned conductive film CD1 is formed as shown in FIG. 19. The photoresist pattern PR1 is then removed. FIG. 19 shows the stage after removal. In such a manner, the wiring M7 can be formed in Step S1. A plurality of the wirings M7 is formed on the interlayer insulating film IL7.

In the above description, a via portion (not shown) buried in the interlayer insulating film IL7 and the wiring M7 are formed in respectively different steps. The via portion (not shown) buried in the interlayer insulating film IL7 and the wiring M7 can be formed in one step and in this case, the via portion (not shown) buried in the interlayer insulating film IL7 and the wiring M7 are formed as one body.

After formation of the wiring M7 in Step S1, the interlayer insulating film IL8 is formed on the interlayer insulating film IL7 so as to cover the wiring M7. This step of forming the interlayer insulating film IL8 includes Step S2 (step of forming an insulating film IL8a), Step S3 (oxygen plasma treatment), and Step S4 (step of forming an insulating film IL8b), each of FIG. 16. The step of forming the interlayer insulating film IL8 will hereinafter be described specifically.

Figure 20:
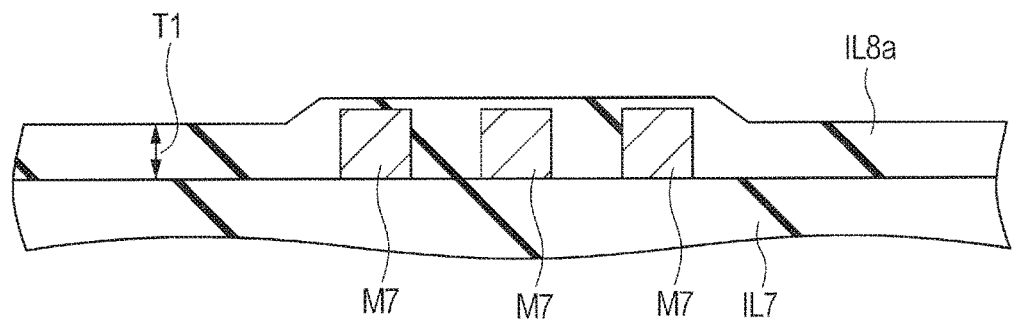
FIG. 20 is a fragmentary cross-sectional view of the semiconductor device during a manufacturing step following that of FIG. 19.

Described specifically, after formation of the wiring M7 in Step S1, an insulating film IL8a is formed by spin coating on the mains surface (entire main surface) of the semiconductor substrate, that is, on the interlayer insulating film IL7 so as to cover the wring M7, as shown in FIG. 20 (Step S2 of FIG. 16).

The insulating film IL8a is an insulating film formed using spin coating, preferably a silicon oxide film formed using spin coating. As the insulating film IL8a, a SOG (spin on glass) film can be preferably used.

In spin coating (spin coating step), a chemical solution as a material for the formation of a thin film (here, the insulating film IL8a) is supplied (added dropwise) onto the semiconductor wafer (the semiconductor substrate SB) and applied onto the semiconductor wafer by rotating the semiconductor wafer at high speed. A solvent in the applied solution (film formed by application) is evaporated by a baking treatment (heating treatment) and the applied solution (film formed by application) is solidified or cured to form a thin film (here, the insulating film IL8a). As the baking treatment, for example, a heating treatment at a temperature of from about 300 to 500° C. in nitrogen or in the air can be performed.

Figure 21:
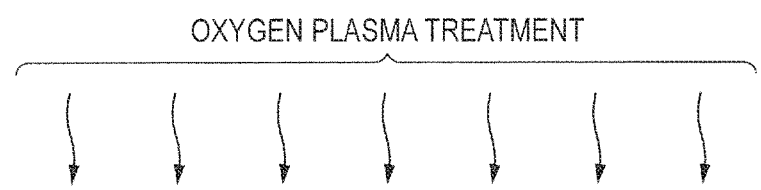
FIG. 21 is a fragmentary cross-sectional view of the semiconductor device during a manufacturing step following that of FIG. 20.
Figure 21:
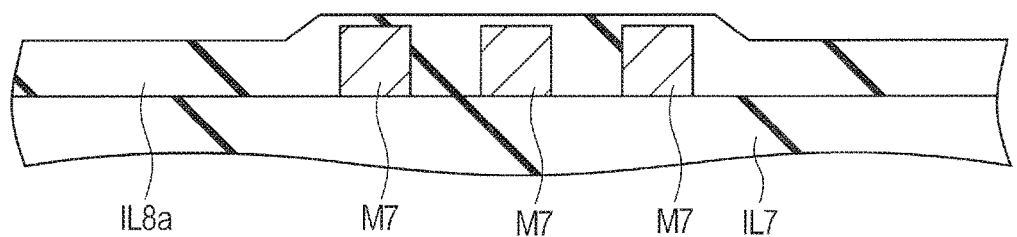

Next, as shown in FIG. 21, the surface of the insulating film IL8a is subjected to an oxygen plasma treatment (Step S3 of FIG. 16).

The treatment (here, oxygen plasma treatment) performed in Step S3 is a hydrophilicity-improving treatment of the surface of the insulating film IL8a. More specifically, the treatment (here, oxygen plasma treatment) performed in Step S3 is a treatment for improving the wettability of the insulating film IL8a with a chemical solution (chemical solution for the formation of the insulating film IL8b) to be used in Step S4 performed later. When Step S3 is performed compared with when Step S3 is not performed, the insulating film IL8a shows higher wettability with the chemical solution (chemical solution for the formation of the insulating film IL8b) in Step S4 which will be described later. In other words, when Step S3 is performed compared with when Step S3 is not performed, the insulating film IL8a is more easily wetted with the chemical solution (chemical solution for the formation of the insulating film IL8b) in Step S4 which will be described later.

During the oxygen plasma treatment in Step S3, the surface of the insulating film IL8a is exposed to oxygen plasma. When the surface of the insulating film IL8a is exposed to oxygen plasma, the surface of the insulating film IL8a is modified and an organic matter or carbon is removed by oxygen plasma from the surface of the insulating film IL8a. This results in improvement in the hydrophilicity of the surface of the insulating film IL8a and improvement in wettability of the insulating film IL8a with the chemical solution (chemical solution for the formation of the insulating film IL8b) to be used in Step S4. The oxygen plasma treatment is therefore suited as the hydrophilicity improving treatment of the surface of the insulating film IL8a. Whether the wettability of the insulating film IL8a with the chemical solution is high or low can be judged by a contact angle of droplets formed by the dropwise addition of the chemical solution onto the insulating film IL8a. A decrease in contact angle can be judged as improvement in wettability (becomes easy to be wetted). Improvement in wettability means improvement in hydrophilicity so that the treatment in Step S3 can be regarded as the hydrophilicity improving treatment of the surface of the insulating film IL8a.

As the hydrophilicity improving treatment of the surface of the insulating film IL8a in Step S3, the oxygen plasma treatment may be replaced by a heat treatment of the semiconductor substrate SB in an ozone ($O_3$) atmosphere.

Figure 22:
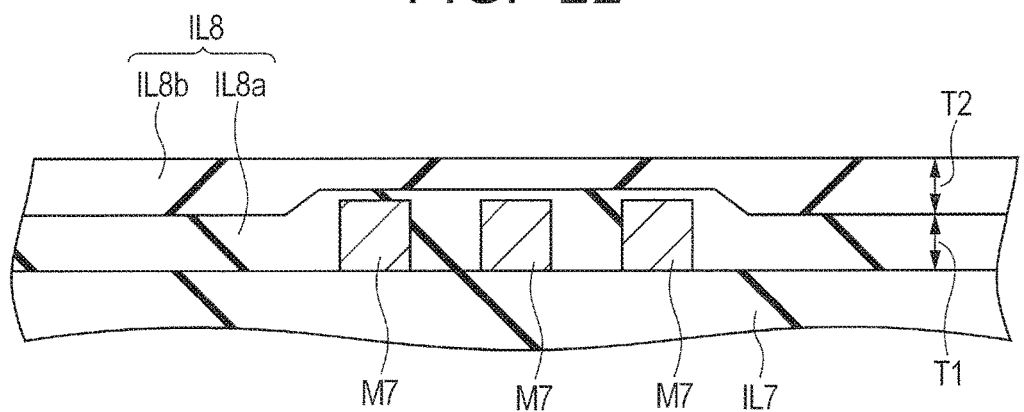
FIG. 22 is a fragmentary cross-sectional view of the semiconductor device during a manufacturing step following that of FIG. 21.

Next, as shown in FIG. 22, an insulating film IL8b is formed by spin coating on the main surface (entire main surface) of the semiconductor substrate SB, that is, on the insulating film IL8a (Step S4 of FIG. 16).

The insulating film IL8b is an insulating film formed using spin coating and is preferably a silicon oxide film formed using spin coating. As the insulating film IL8b, a SOG can be preferably used.

The insulating film IL8b is formed on the insulating film IL8a so as to be contiguous to the insulating film IL8a. The treatment of Step S3 is performed after Step S2 but before Step S4 so that a modified layer resulting from the modification of the surface (surface layer portion) of the insulating film IL8a is formed by the treatment of Step S3 and the modified layer may be present on the interface between the insulating film IL8a and the insulating film IL8b.

In Step S4 similar to Step S2, the insulating film IL8b is formed by spin coating (spin coating step) so that a chemical solution as a material for the formation of a thin film (here, the insulating film IL8b) is supplied (added dropwise) onto the semiconductor wafer (semiconductor substrate SB) and applied onto the semiconductor wafer by rotating the semiconductor wafer at high speed. A solvent in the applied solution (film formed by application) is then evaporated by a baking treatment (heating treatment) and then, the applied solution (film formed by application) is solidified or cured to form a thin film (here, the insulating film IL8b). As the baking treatment, for example, a heating treatment at a temperature of from about 300 to 500° C. in nitrogen or in the air can be performed.

The insulating film IL8b and the insulating film IL8a are made of preferably the same material, more preferably a silicon oxide. The chemical solution (chemical solution for the formation of the insulating film IL8b) used in Step S4 and the chemical solution (chemical solution for the formation of the insulating film IL8a) used in Step S2 are the same (same kind of) chemical solutions.

In forming an insulating film by spin coating, hydrophilicity of a film lying thereunder is important. When the underlying film is a film formed using CVD (chemical vapor deposition) (which will hereinafter be called "CVD film"), an insulating film can be easily and precisely formed on the CVD film by spin coating because of relatively high hydrophilicity of the surface of the CVD film. When the underlying film is a film formed by spin coating (which will hereinafter be called "spin coated film"), on the other hand, it is not easy to precisely form another insulating film on the spin coated film because the surface of the spin coated film is likely to have reduced hydrophilicity.

In the present embodiment, on the other hand, after formation of the insulating film IL8a by spin coating in Step S2 and before formation of the insulating film IL8b on the insulating film IL8a by spin coating in Step S4, the hydrophilicity improving treatment of the surface of the insulating film IL8a is performed in Step S3. This makes it possible to improve the wettability of the insulating film IL8a with the chemical solution to be used for the formation of the insulating film IL8b in Step S4 and thereby form the insulating film IL8b easily and precisely on the insulating film IL8a, which is a spin coated film, by spin coating.

By performing Steps S2, S3, and S4 in such a manner, the interlayer insulating film IL8 comprised of a stacked film (stacked insulating film) of the insulating film IL8a and the insulating film IL8b on the insulating film IL8a is formed. Steps S2, S3, and S4 therefore can also be regarded as steps for forming the interlayer insulating film IL8. The stacked insulating film corresponds to a stacked film comprised of a plurality of insulating films. The interlayer insulating film IL8 is formed on the interlayer insulating film IL7 so as to cover the wiring M7.

When different from the present embodiment, the wiring M7 is a buried wiring formed by the damascene process, the wiring M7 is buried in the interlayer insulating film IL7 so that an interlayer insulating film formed on the interlayer insulating film IL7 is likely to be flat. In the present embodiment, however, the wiring M7 is a wiring formed by patterning a conductive film and is preferably an aluminum wiring. In this case, the wiring M7 is not buried in the interlayer insulating film IL7 and protrudes from the upper surface of the interlayer insulating film IL7. When the interlayer insulating film IL8 is formed on the interlayer insulating film IL7 so as to cover the wiring M7, there is a fear of a step difference or unevenness attributable to the wiring M7 appearing from the surface of the interlayer insulating film IL8. The surface (upper surface) of the interlayer insulating film IL8 formed by the method of the present embodiment, however, has high flatness and almost no step difference or unevenness attributable to the wiring M7 appears on the surface of the interlayer insulating film IL8 as will be described later. After formation of the interlayer insulating film IL8 by Steps S2, S3, and S4, therefore, the interlayer insulating film IL8 is not subjected to a CMP treatment (polishing treatment) for enhancing the flatness of the interlayer insulating film IL8.

After formation of the interlayer insulating film IL8 by Steps S2, S3, and S4, a through-hole (hole) SH is formed in the interlayer insulating film IL8 (Step S5 of FIG. 16).

Figure 23:
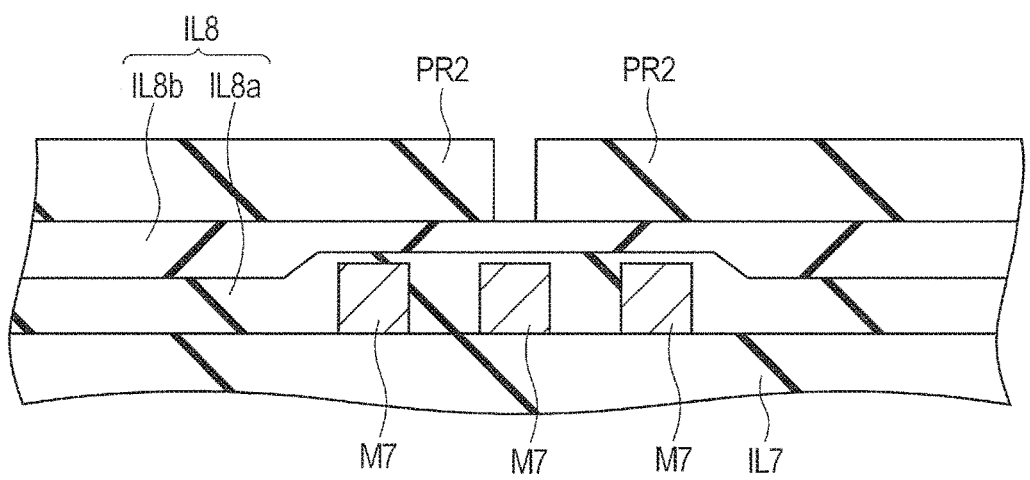
FIG. 23 is a fragmentary cross-sectional view of the semiconductor device during a manufacturing step following that of FIG. 22.
Figure 24:
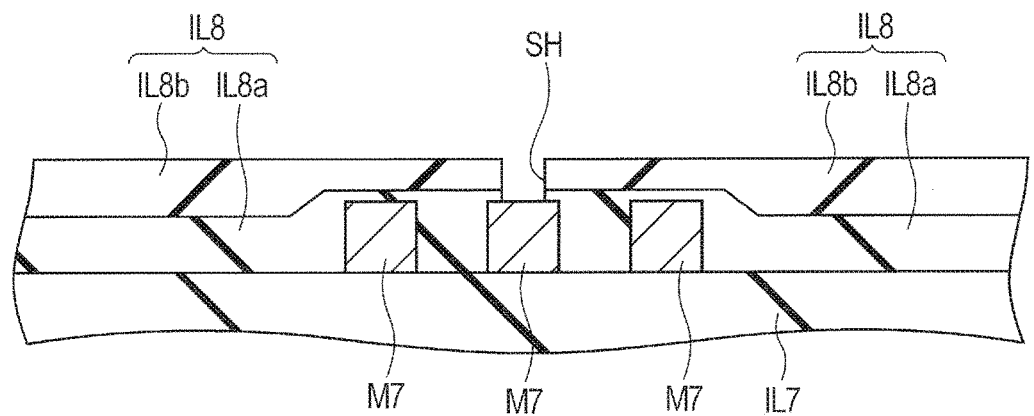
FIG. 24 is a fragmentary cross-sectional view of the semiconductor device during a manufacturing step following that of FIG. 23.

More specifically, as shown in FIG. 23, after formation of a photoresist pattern PR2 on the interlayer insulating film IL8 by photolithography, the interlayer insulating film IL8 is dry etched with the photoresist pattern PR2 as an etching mask and a through-hole SH is then formed in the interlayer insulating film IL8 as shown in FIG. 24. The photoresist pattern PR2 is then removed. FIG. 24 shows the stage after removal. The through-hole SH penetrates through the interlayer insulating film IL8 and the upper surface of the wiring M7 is exposed at the bottom portion of the through-hole SH.

Figure 25:
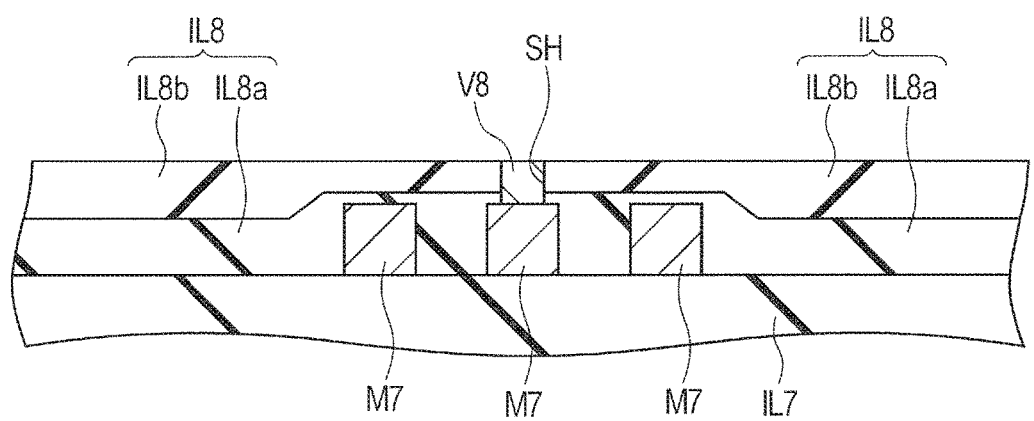
FIG. 25 is a fragmentary cross-sectional view of the semiconductor device during a manufacturing step following that of FIG. 24.

Next, as shown in FIG. 25, a via portion V8 is formed in the through-hole SH by filling the through-hole SH with a conductive film (Step S6 of FIG. 16). The via portion V8 can be regarded as a conductive plug. The formation step of each of the via portions V1, V2, V3, V4, and V5 has already been described above so that a description on the step of forming the via portion V8 in Step S6 is omitted here. The via portion V8 is contiguous, at the lower surface thereof, to the wiring M7 and is therefore electrically coupled to the wiring M7.

A wiring M8 is then formed on the interlayer insulating film IL8 filled with the via portion V8 (Step S7 of FIG. 16).

Figure 26:
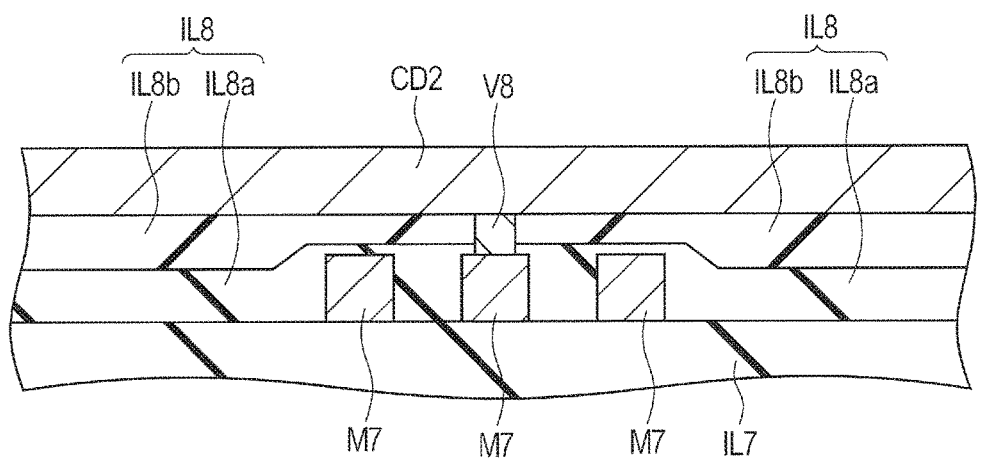
FIG. 26 is a fragmentary cross-sectional view of the semiconductor device during a manufacturing step following that of FIG. 25.
Figure 27:
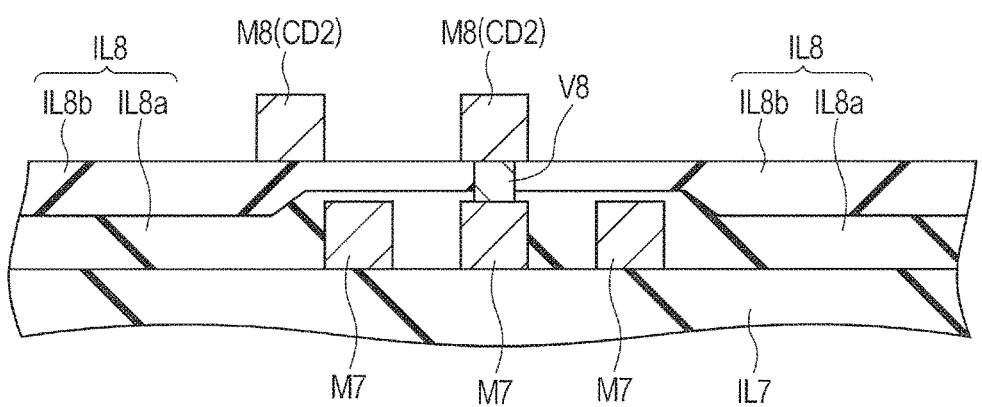
FIG. 27 is a fragmentary cross-sectional view of the semiconductor device during a manufacturing step following that of FIG. 26.

A method of forming the wiring M8 is essentially similar to that of the wiring M7. Described specifically, as shown in FIG. 26, a conductive film (metal film) CD2 for the formation of the wiring M8 is formed on the interlayer insulating film IL8. The conductive film CD2 is comprised of, for example, a film obtained by stacking a barrier conductor film, an aluminum film, and another barrier conductor film one after another in order of mention and it can be formed using sputtering. A photoresist pattern (not shown) is then formed on the conductive film CD2 by photolithography and with the resulting photoresist pattern as an etching mask, the conductive film CD2 is patterned by etching (dry etching). Thus, as shown in FIG. 27, the wiring M8 can be formed. In such a manner, the wiring M8 can be formed in Step S7. A plurality of the wirings M8 is formed on the interlayer insulating film IL8.

The via portion V8 and the wiring M8 formed by respectively different steps are shown in the drawing. The via portion V8 and the wiring M8 are formed separately. In another mode, the via portion V8 and the wiring M8 can be formed in one step. In this case, the via portion V8 and the wiring M8 are formed as one body.

Investigation Examples

Figure 32:
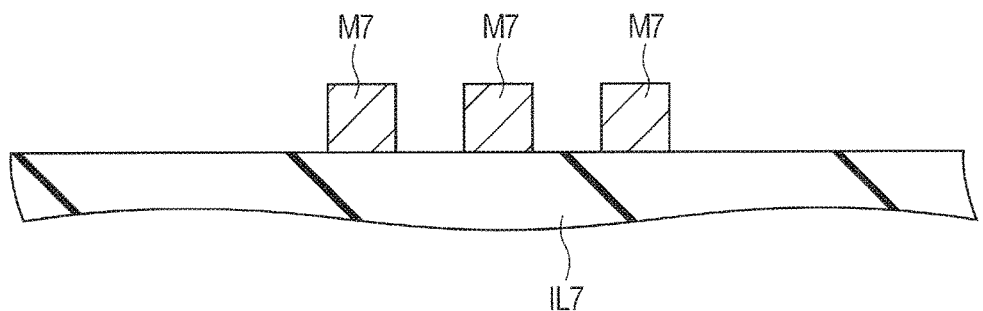
FIG. 32 is a fragmentary cross-sectional view of a semiconductor device of Second Investigation Example during a manufacturing step thereof.
Figure 33:
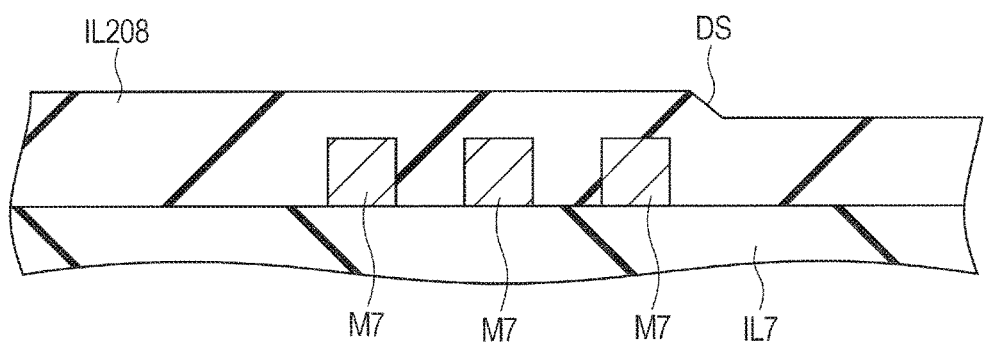
FIG. 33 is a fragmentary cross-sectional view of the semiconductor device during a manufacturing step following that of FIG. 32.
Figure 34:
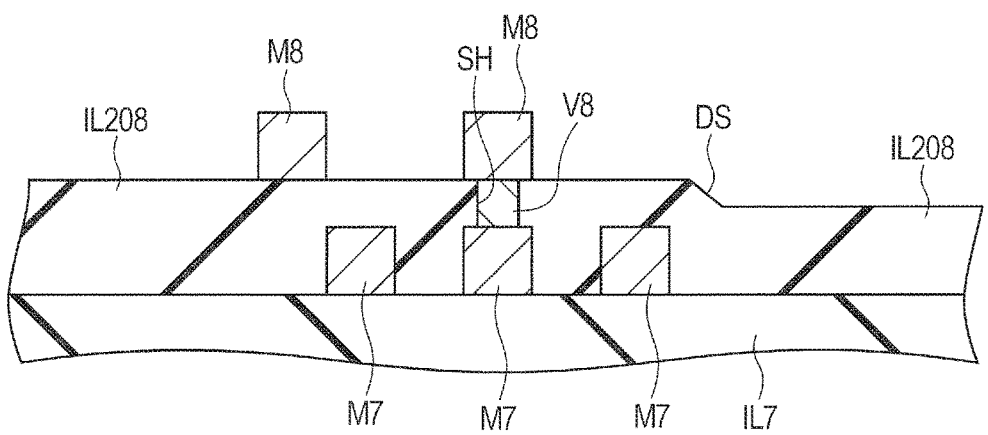
FIG. 34 is a fragmentary cross-sectional view of the semiconductor device during a manufacturing step following that of FIG. 33.
Figure 35:
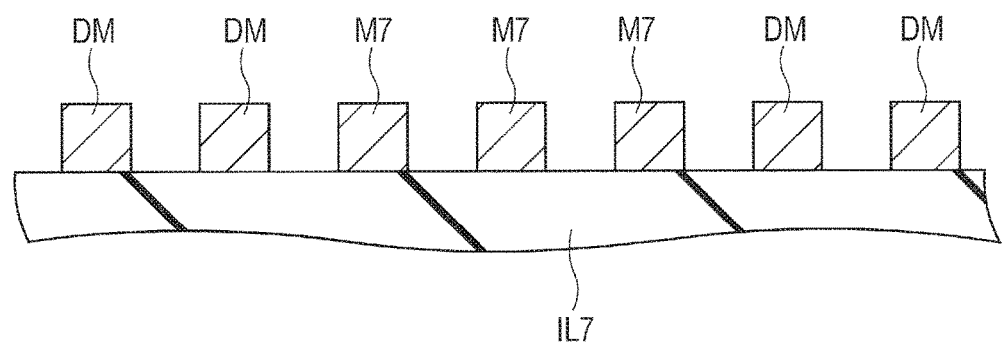
FIG. 35 is a fragmentary cross-sectional view of a semiconductor device of Third Investigation Example during a manufacturing step thereof.
Figure 36:
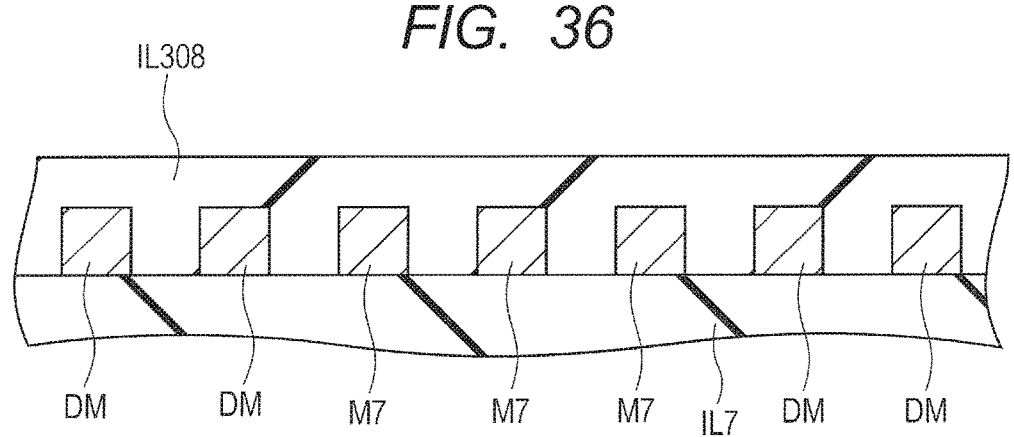
FIG. 36 is a fragmentary cross-sectional view of the semiconductor device during a manufacturing step following that of FIG. 35.

Next, examples investigated by the present inventors will be described. FIGS. 28 to 31 are fragmentary cross-sectional views, during manufacturing steps, of a semiconductor device of First Investigation Example investigated by the present inventors. FIGS. 32 to 34 are fragmentary cross-sectional views, during manufacturing steps, of a semiconductor device of Second Investigation Example investigated by the present inventors. FIGS. 35 and 36 are fragmentary cross-sectional views, during manufacturing steps, of a semiconductor device of Third Investigation Example investigated by the present inventors.

Figure 28:
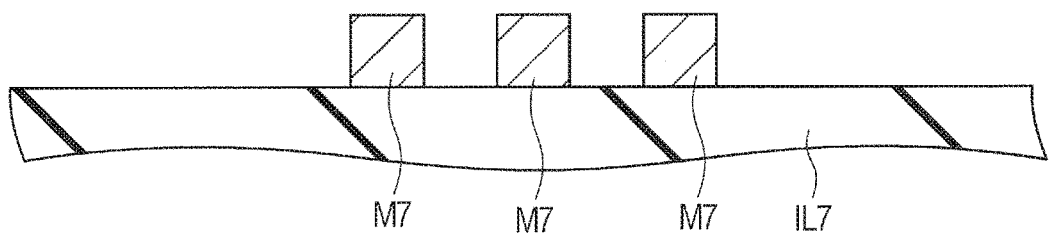
FIG. 28 is a fragmentary cross-sectional view of a semiconductor device of First Investigation Example during a manufacturing step thereof.

FIGS. 28 and 32, similar to FIG. 19, show the wiring M7 formed on the interlayer insulating film IL7. FIG. 35 shows the wiring M7 and a dummy wiring DM formed on the interlayer insulating film IL7. FIGS. 28 to 35, similar to FIGS. 17 to 27, also do not show a structure below the interlayer insulating film IL7.

The present embodiment, First Investigation Example, and Second Investigation Example are different from each other in a method of forming an interlayer insulating film. First, manufacturing steps of First Investigation Example will be described specifically referring to FIGS. 28 to 31.

Figure 29:
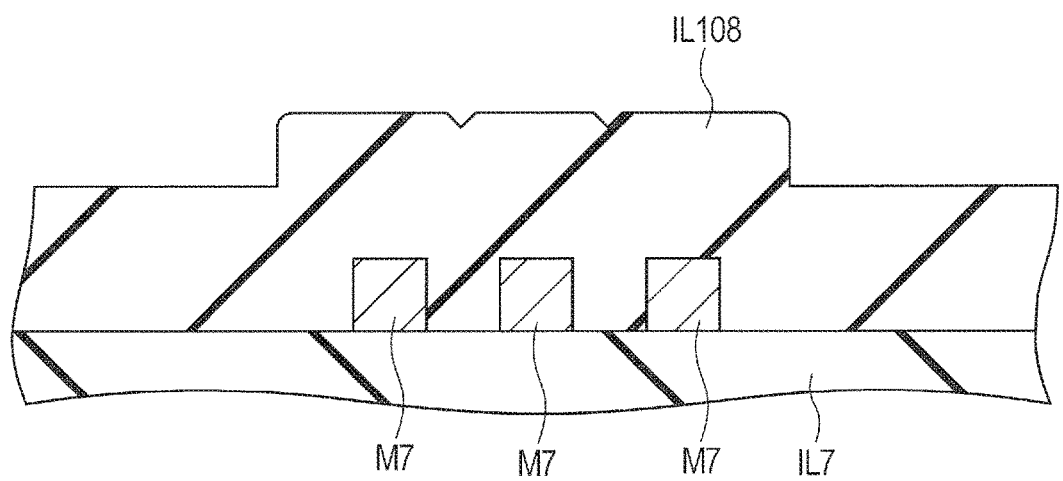
FIG. 29 is a fragmentary cross-sectional view of the semiconductor device during a manufacturing step following that of FIG. 28.

Described specifically, as shown in FIG. 28, in First Investigation Example, the wiring M7 is formed on the interlayer insulating film IL7 and then, as shown in FIG. 29, an interlayer insulating film IL108 is formed on the interlayer insulating film IL7 using CVD so as to cover the wiring M7. The interlayer insulating film IL108 is an insulating film formed using CVD and it is preferably a silicon oxide film formed using CVD.

Figure 30:
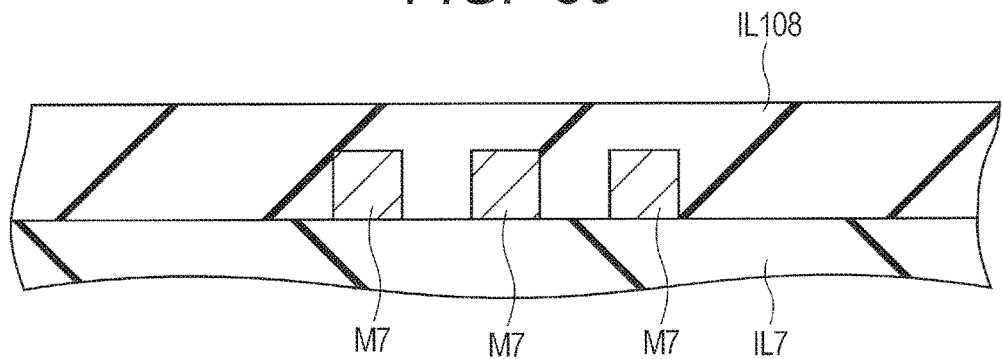
FIG. 30 is a fragmentary cross-sectional view of the semiconductor device during a manufacturing step following that of FIG. 29.

Next, as shown in FIG. 30, the upper surface of the interlayer insulating film IL108 is polished using CMP to planarize it. As a result, the interlayer insulating film IL108 having an almost flat upper surface is formed. The interlayer insulating film IL108 is formed on the interlayer insulating film IL7 so as to cover the wiring M7.

Figure 31:
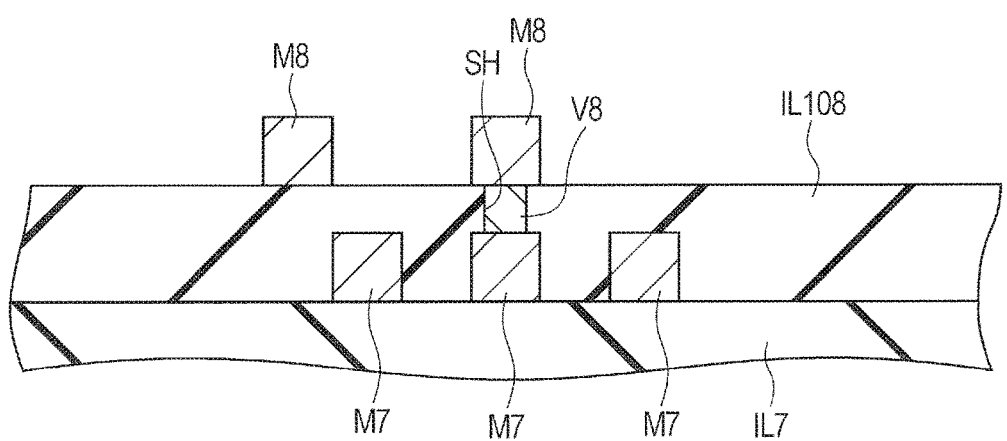
FIG. 31 is a fragmentary cross-sectional view of the semiconductor device during a manufacturing step following that of FIG. 30.

Then, as shown in FIG. 31, after formation of a through-hole SH in the interlayer insulating film IL108 by photolithography and dry etching, the through-hole SH is filled with a conductive film to form a via portion V8 in the through-hole SH. A wiring M8 is then formed on the interlayer insulating film IL108.

Next, manufacturing steps of Second Investigation Example will be described specifically referring to FIGS. 32 to 34.

Described specifically, the wiring M7 is formed on the interlayer insulating film IL7 as shown in FIG. 32. In Second Investigation Example, as shown in FIG. 33, an interlayer insulating film IL208 is formed on the interlayer insulating film IL7 by spin coating so as to cover the wiring M7. The interlayer insulating film IL208 is an insulating film formed using spin coating and it is preferably a silicon oxide film formed using spin coating.

As shown in FIG. 34, a through-hole SH is then formed in the interlayer insulating film IL208 by photolithography and dry etching and then the through-hole SH is filled with a conductive film to form a via portion V8 in the through-hole SH. A wiring M8 is then formed on the interlayer insulating film IL208.

In Second Investigation Example, the interlayer insulating film IL208 is formed by spin coating in a step corresponding to Step S2. The thickness of the interlayer insulating film IL208 thus formed is greater than that of the insulating film IL8a in the present embodiment and almost agrees with a sum of the thickness of the insulating film IL8a and the thickness of the insulating film IL8b formed in the present embodiment. In Second Investigation Example, different from the present embodiment, neither a step corresponding to Step S3 nor a step corresponding to Step S4 is performed. This means that the interlayer insulating film IL208 is formed by a single spin coating step.

In other words, in the present embodiment, the interlayer insulating film IL8 includes a plurality of insulating films (here, the insulating film IL8a and the insulating film IL8b) formed by spin coating, while in Second Investigation Example, the interlayer insulating film IL208 is comprised of a single-layer insulating film formed by spin coating.

First, First Investigation Example will be described.

The interlayer insulating film IL108 in First Investigation Example is an insulating film formed using CVD. The insulating film formed using CVD has such a property that it is conformal to an underlying shape. The interlayer insulating film IL108 formed using CVD is, as shown in FIG. 29, conformal to the wiring M7 and the interlayer insulating film IL108 therefore has, on the surface thereof, a step difference (or unevenness) reflecting the shape of the wiring M7.

In First Investigation Example, after formation of the interlayer insulating film IL108 by CVD, a polishing step for polishing the upper surface of the interlayer insulating film IL108 by CMP should be performed. By this CMP step, the upper surface of the interlayer insulating film IL108 is planarized as shown in FIG. 30.

When a subsequent manufacturing step is performed while having, on the upper surface of the interlayer insulating film IL108, the step difference (or unevenness) reflecting the shape of the wiring M7 without carrying out a step of subjecting the interlayer insulating film IL108 to a CMP treatment, there is a fear of the following inconveniences occurring.

Described specifically, a step difference (or unevenness) on the upper surface of the interlayer insulating film IL108 makes it difficult to precisely form a photoresist pattern on the interlayer insulating film IL108 by photolithography. For example, in forming a through-hole SH in the interlayer insulating film IL108, the through-hole SH is formed by forming a photoresist pattern corresponding to the photoresist pattern PR2 on the interlayer insulating film IL108 by photolithography and etching the interlayer insulating film IL108 with the photoresist pattern as an etching mask. A step difference on the upper surface of the interlayer insulating film IL108 interferes with precise formation of a photoresist pattern corresponding to the photoresist pattern PR2. The step difference on the upper surface of the interlayer insulating film IL108 makes it difficult to adjust the focus for exposure upon exposure by photolithography and there is a fear of the position or shape of the photoresist pattern thus formed from deviating from the designed one. This may lead to deterioration in the reliability of a semiconductor device. It is therefore necessary to enhance the flatness of the upper surface of the interlayer insulating film IL108.

In addition, the step difference on the upper surface of the interlayer insulating film IL108 may cause an etching residue at a position adjacent to the step difference and an inconvenience due to this etching residue may occur. For example, the wiring M8 is formed by forming a conductive film corresponding to the conductive film CD2 on the interlayer insulating film IL108 and then patterning the conductive film by photolithography and etching. In the dry etching step upon patterning, there is a fear of an etching residue of the conductive film remaining at a position adjacent to the step difference on the upper surface of the interlayer insulating film IL108. The etching residue of the conductive film may be causative of a short circuit or leakage and it leads to deterioration in the reliability of a semiconductor device. It is therefore necessary to prevent an etching residue of a conductive film from remaining on the interlayer insulating film IL108 as much as possible. The upper surface of the interlayer insulating film IL108 therefore should have improved flatness.

Since the upper surface of the interlayer insulating film IL108 should be planarized, the interlayer insulating film IL108 is formed using CVD, followed by planarization of the upper surface of the interlayer insulating film IL108 by a CMP treatment.

Introduction of the CMP step after formation of the interlayer insulating film IL108 may however complicate the manufacturing steps of a semiconductor device and increase the manufacturing cost. In order to reduce a manufacturing cost of a semiconductor device, a polishing step is desirably omitted. In particular, when the damascene process is not used for the formation of wirings, in other words, wirings are formed by patterning a conductive film by photolithography and etching, a wiring formation step does not require the CMP treatment so that addition of the CMP treatment of the interlayer insulating film IL108 tends to cause an increase in the manufacturing cost of a semiconductor device.

The present inventors are therefore studying the formation of an interlayer insulating film by spin coating for the purpose of eliminating the necessity of the CMP treatment of the upper surface of the interlayer insulating film.

The insulating film formed by CVD has such a property that it is conformal to an underlying shape so that the insulating film is likely to have, on the surface thereof, a step difference (or unevenness) reflecting the shape of an underlying wiring. In the case of an insulating film formed by spin coating, since a chemical solution used for formation of the film by application has fluidity, it is formed not conformal to an underlying shape and is unlikely to have, on the surface thereof, a step difference (or unevenness) reflecting the shape of an underlying wiring.

Using, as an interlayer insulating film, an insulating film formed by spin coating is presumed to allow the interlayer insulating film to have a flat surface without a CMP treatment after film formation.

In Second Investigation Example described referring to FIGS. 32 to 34, an insulating film IL208 is formed using spin coating. The surface of the insulating film IL208 in Second investigation Example, that is, the surface of the interlayer insulating film IL208 is more flat than the surface of the interlayer insulating film IL108 before the CMP treatment in First Investigation Example.

Compared with the insulating film formed by CVD, the insulating film formed by spin coating has a flat surface. But even if spin coating is used, it is difficult to completely eliminate the influence of unevenness of an underlying wiring and form an insulating film having a completely flat surface. Even in Second Investigation Example, the interlayer insulating film IL208 inevitably has, on the surface thereof, a step difference DS reflecting the shape of the wiring M7.

The step difference on the surface of the interlayer insulating film IL208 is unlikely to occur in a region having therein the wirings M7 placed densely and it is likely to occur in the vicinity of a boundary between the region having therein the wirings M7 placed densely and a region having therein the wirings M7 placed sparsely.

In spin coating, a thin film (here, the interlayer insulating film IL208) is formed by supplying (adding dropwise) a chemical solution, which is a material for forming the thin film (here, the interlayer insulating film IL208), onto the semiconductor wafer (semiconductor substrate SB), applying it onto the semiconductor wafer by rotating the semiconductor wafer at high speed, and then carrying out a baking treatment (heating treatment). The chemical solution transfers towards the peripheral side of the semiconductor wafer by centrifugal force, but when the semiconductor wafer is rotated, the wiring M7 acts to block the transfer of the chemical solution. Downstream of the region having therein the wirings M7 placed densely in a direction from the center of the semiconductor wafer toward the periphery of the semiconductor wafer, the chemical solution is unlikely to be delivered and the thickness of the chemical solution (film formed by application) becomes relatively thin. In short, there occurs unevenness in the thickness of a film formed by applying the chemical solution onto the main surface of the semiconductor wafer. A step difference DS therefore inevitably occurs on the surface of the interlayer insulating film IL208 in the vicinity of a boundary between the region having therein the wirings M7 placed densely and the region having therein the wirings M7 placed sparsely.

The viscosity of the chemical solution to be supplied onto the semiconductor wafer for the formation of an insulating film by spin coating is determined in consideration of the thickness of the insulating film to be formed. An increase in the viscosity of the chemical solution leads to an increase in the thickness of a film formed by application of the chemical solution remaining on the semiconductor wafer when the semiconductor wafer is rotated, while a decrease in the viscosity of the chemical solution leads to a decrease in the thickness of a film formed by application of the chemical solution remaining on the semiconductor wafer when the semiconductor wafer is rotated. This means that a thick insulating film can be formed on the semiconductor wafer by increasing the viscosity of the chemical solution, while the thickness of an insulating film formed on the semiconductor wafer decreases by decreasing the viscosity of the chemical solution.

When the chemical solution has high viscosity, a step difference DS is likely to appear on the surface of the interlayer insulating film IL208 in the vicinity of a boundary between a region having therein the wirings M7 placed densely and a region having therein the wirings M7 placed sparsely. The chemical solution having low viscosity, on the other hand, easily spreads over the semiconductor wafer so that a step difference DS is unlikely to occur on the surface of the interlayer insulating film IL208.

When the chemical solution to be used for the formation of the interlayer insulating film IL208 has high viscosity, the interlayer insulating film IL208 thus formed has an increased thickness, but instead, a step difference DS is likely to appear on the surface of the interlayer insulating film IL208. When the chemical solution has low viscosity, the interlayer insulating film IL208 thus formed has a reduced thickness but instead, a step difference DS is unlikely to occur on the surface of the interlayer insulating film IL208.

Decreasing the thickness of the interlayer insulating film IL208 however increases a parasitic capacitance between an upper wiring (here, the wiring M8) and a lower wiring (here, the wiring M7) that perpendicularly face with each other with the interlayer insulating film IL208 therebetween so that the interlayer insulating film IL208 is required to have a certain thickness. In Second Investigation Example, therefore, it is difficult to thin the interlayer insulating film IL208 and therefore difficult to reduce the viscosity of the chemical solution to be used for the formation of the interlayer insulating film IL208 by spin coating. This means that it is necessary to increase the viscosity of the chemical solution to be used for formation of the interlayer insulating film IL208 by spin coating in order to secure a certain thickness of the interlayer insulating film IL208. This inevitably causes a step difference DS on the surface of the interlayer insulating film IL208.

As described above in association with First Investigation Example, when a photoresist pattern is formed on the interlayer insulating film IL208 by photolithography, a step difference on the surface of the interlayer insulating film IL208 makes it difficult to precisely form the photoresist pattern. In addition, due to a step difference, if any, on the surface of the interlayer insulating film IL208, an unnecessary etching residue (etching residue of a conductive film) remains at a position adjacent to the step difference and it may cause inconveniences attributable to the etching residue. The semiconductor device thus obtained may have deteriorated reliability due to such conveniences.

As Third Investigation Example, therefore, a dummy wiring is formed in the layer having therein the wiring M7 and enhancement of the surface flatness of an interlayer insulating film is investigated. Manufacturing steps of Third investigation Example will hereinafter be described specifically referring to FIGS. 35 and 36.

In Third Investigation Example, as shown in FIG. 35, a wiring M7 and a dummy wiring DM are formed on the interlayer insulating film IL7. More specifically, the wiring M7 and the dummy wiring DM are formed by forming a conductive film corresponding to the conductive film CD1 on the interlayer insulating film IL7 and then patterning the conductive film. The wiring M7 and the dummy wiring DM are formed in the same step by using a conductive film common to them. Steps of Third Investigation Example performed thereafter are similar to those of Second Investigation Example. Described specifically, as shown in FIG. 36, an interlayer insulating film IL308 is formed on the interlayer insulating film IL7 by using spin coating so as to cover the wiring M7 and the dummy wiring DM. The interlayer insulating film IL308 is an insulating film formed using spin coating and is preferably a silicon oxide film formed using spin coating. Then, the through-hole SH, the via portion V8 and the wiring M8 are formed but the illustration and description of them is omitted here.

In Third Investigation Example, the dummy wiring DM is placed in a vacant space having no wiring M7 placed therein. Most regions therefore have therein the wiring M7 or the dummy wiring DM, making it difficult to cause a step difference such as the above-described step difference DS on the surface of the interlayer insulating film IL308 formed by spin coating.

In Third Investigation Example, however, the dummy wiring DM should be formed in the layer having the wiring M7 therein. In other words, when there is a vacant space in which the wiring M7 is not formed, the dummy wiring DM should be placed therein. This requires re-designing of the wiring layer including the wiring M7 and the dummy wiring DM. This leads to a change in the whole design of the semiconductor device and application of it poses a large burden. Even when the wiring layer including the wiring M7 and the dummy wiring DM is redesigned, layout of wirings becomes difficult. In consideration of the labor for redesigning and manufacturing cost of the semiconductor device, it is not advisable to select Third Investigation Example in which the dummy wiring DM is provided.

(Main Characteristics and Advantages)

In the present embodiment, therefore, an interlayer insulating film is formed by stacking a plurality of insulating films each formed by spin coating.

In the present embodiment, the insulating film IL8a for the interlayer insulating film IL8 is formed using spin coating in Step S2, the insulating film IL8a is subjected to the hydrophilicity improving treatment (first treatment) in Step S3, and then the insulating film IL8b for the interlayer insulating film IL8 is formed on the insulating film IL8a by spin coating in Step S4. The interlayer insulating film IL8 is comprised of a stacked insulating film including the insulating film IL8a and the insulating film IL8b.

One of the main characteristics of the present embodiment is that the insulating film IL8a for the interlayer insulating film IL8 is formed by spin coating in Step S2 and the insulating film IL8b for the interlayer insulating film IL8 is formed on the insulating film IL8a by spin coating in Step S4. This means that in the present embodiment, the interlayer insulating film IL8 is formed by stacking a plurality of insulating films, that is, the insulating films IL8a and IL8b, each formed using spin coating. The interlayer insulating film IL8 can therefore have improved surface flatness, which will be described later specifically.

As described above, when an insulating film is formed by spin coating, the viscosity of a chemical solution (chemical solution for the formation of an insulating film) to be supplied onto the semiconductor wafer should be increased in order to increase the thickness of the insulating film. This however may lead to generation of a step difference such as the step difference DS on the surface of the insulating film thus formed. When an insulating film is formed by spin coating and the insulating film thus formed has a small thickness, the viscosity of a chemical solution (chemical solution for the formation of an insulating film) to be supplied onto the semiconductor wafer can be decreased. This makes it difficult to generate a step difference such as the step difference DS on the surface of the insulating film thus formed.

In the present embodiment, the interlayer insulating film IL8 is formed by stacking a plurality of insulating films, that is, the insulating films IL8a and IL8b, each formed by spin coating so that the insulating films IL8a and IL8b formed by spin coating can have a thin (small) thickness. This makes it possible to reduce the viscosity of the chemical solution to be used for the formation of each of the insulating films IL8a and IL8b by spin coating and thereby making it possible to suppress or prevent generation of a step difference on the surface of the insulating films IL8a and IL8b thus formed.

Supposing that the thickness of the interlayer insulating film IL8 in the present embodiment and the thickness of the interlayer insulating film IL208 in Second Investigation Example are equal to each other, the insulating films IL8a and IL8b of the present embodiment each have a thickness smaller than that of the interlayer insulating film IL208. In Second Investigation Example, the thick interlayer insulating film IL208 is formed by a single spin coating step so that the chemical solution used therefore should have a high viscosity and therefore the interlayer insulating film IL208 is likely to have, on the surface thereof, the step difference DS. In the present example, on the other hand, the thick interlayer insulating film IL8 is formed by a plurality of spin coating steps so that a chemical solution having a low viscosity can be used and a step difference such as the above-described step difference DS can be prevented from occurring on the surface of the interlayer insulating film IL8. As a result, the interlayer insulating film IL8 can have improved surface flatness.

The thickness of an insulating film formed by a single spin coating step is smaller in the present embodiment where a thick interlayer insulating film is formed by stacking a plurality of insulating films formed by a plurality of spin coating steps, respectively, than in Second Investigation Example where a thick interlayer insulating film is formed in a single spin coating step so that a chemical solution having a low viscosity can be used in the spin coating step and therefore, generation of a step difference on the surface of the interlayer insulating film can be suppressed. This leads to improvement in the surface flatness of the insulating film thus formed.

The other one of the main characteristics of the present embodiment is that after formation of the insulating film IL8a for the interlayer insulating film IL8 by spin coating in Step S2 but before formation of the insulating film IL8b for the interlayer insulating film IL8 on the insulating film IL8a by spin coating in Step S4, the insulating film IL8a is subjected to the hydrophilicity improving treatment in Step S3. The interlayer insulating film IL8 can therefore has improved surface flatness, which will be described below specifically.

Supposing that after formation of the insulating film IL8a by spin coating in Step S2, the insulating film IL8b is formed on the insulating film IL8a by spin coating in Step S4 without carrying out Step S3, this will be called "Fourth Investigation Example". In Fourth Investigation Example, since the surface of the insulating film IL8a obtained after solidification (curing) by a baking treatment in the spin coating step has low hydrophilicity (wettability), the wettability of the insulating film IL8a with the chemical solution to be used for the formation of the insulating film IL8b becomes low in the spin coating step for the formation of the insulating film IL8b. This may interfere with precise formation of the insulating film IL8b.

In other words, in the spin coating step for the formation of the insulating film IL8b, the chemical solution for the formation of the insulating film IL8b is supplied (added dropwise) onto the semiconductor wafer (the semiconductor wafer SB) and applied onto the semiconductor wafer by rotating the semiconductor wafer at high speed. Low wettability, with the chemical solution, of the underlying insulating film IL8a to which the chemical solution is applied prevents smooth wetting and spreading of the chemical solution over the semiconductor wafer. This may presumably lead to formation of an applied film having uneven thickness. As a result, the insulating film IL8b formed thereon undesirably has uneven film thickness and acts to deteriorate the flatness of the surface of the interlayer insulating film IL8 thus obtained. This means that low hydrophilicity of a film (here, the insulating film IL8a) lying under a film to be formed (the insulating film IL8b) is not preferred in carrying out a spin coating step. It is therefore necessary not to carry out the spin coating step for forming the insulating film IL8b while the insulating film IL8a has low hydrophilicity.

The insulating film formed by the spin coating step, followed by the baking treatment inevitably has a surface with low hydrophilicity (wettability). The insulating film IL8a formed in Step S2 has low hydrophilicity so that without Step S3 as in Fourth Investigation Example, the insulating film IL8b cannot easily be formed on the insulating film IL8a by spin coating in Step S4. This may lead to a failure in precise formation of the insulating film IL8b. For example, in the spin coating step, smooth wetting and spreading of the chemical solution for the formation of the insulating film IL8b over the entirety of the semiconductor wafer (the semiconductor substrate SB) is prevented, the chemical solution cannot be applied uniformly, and the insulating film IL8b thus formed may have uneven thickness. This leads to formation of the interlayer insulating film IL8 having deteriorated surface flatness.

In the present embodiment, on the other hand, after formation of the insulating film IL8a for the interlayer insulating film IL8 by spin coating in Step S2, the hydrophilicity improving treatment of the insulating film IL8a is performed in Step S3 and then, the insulating film IL8b for the interlayer insulating film IL8 is formed on the insulating film IL8a by spin coating in Step S4. By the hydrophilicity improving treatment of the insulating film IL8a in Step S3, the insulating film IL8 can have improved wettability with the chemical solution to be used for the formation of the insulating film IL8b in the spin coating step for the formation of the insulating film IL8b in Step S4. This facilitates wetting and spreading of the chemical solution for the formation of the insulating film IL8b over the entirety of the semiconductor wafer (semiconductor substrate SB), making possible the precise formation of the insulating film IL8b. For example, since the chemical solution for the formation of the insulating film IL8b easily wets and spreads over the entirety of the semiconductor wafer (semiconductor substrate SB), uneven application can be prevented, a film obtained by application can have more uniform thickness, and as a result, the insulating film IL8b thus formed has more uniform thickness. This also contributes to formation of the interlayer insulating film IL8 having improved surface flatness.

In the present embodiment, the insulating film IL8a for the interlayer insulating film IL8 is formed by spin coating in Step S2, the hydrophilicity improving treatment of the insulating film IL8a is performed in Step S3, and the insulating film IL8b for the interlayer insulating film IL8 is formed on the insulating film IL8a by spin coating in Step S4. Since the interlayer insulating film IL8 is formed by stacking the insulating films IL8a and IL8b, each formed by spin coating, thickness of the insulating film formed by a single spin coating step can be reduced. The viscosity of the chemical solution used in the spin coating step can therefore be reduced and as a result, the interlayer insulating film IL8 thus formed can have improved surface flatness. In addition, the hydrophilicity improving treatment of the insulating film IL8a is performed in Step S3, that is, after formation of the insulating film IL8a by spin coating and before formation of the insulating film IL8b on the insulating film IL8a by spin coating so that wettability of the insulating film IL8a with the chemical solution used for the formation of the insulating film IL8b can be improved and the interlayer insulating film IL8 thus formed can have improved surface flatness. As a result, the interlayer insulating film IL8 comprised of a stacked insulating film including the insulating film IL8a and the insulating film IL8b on the insulating film IL8a can have improved surface flatness.

The present embodiment can provide the interlayer insulating film IL8 having high flatness so that inconveniences which will occur when the interlayer insulating film is inferior in flatness can be suppressed or prevented. For example, when a photoresist pattern (for example, the photoresist pattern PR2) is formed on the interlayer insulating film IL8 by photolithography, the photoresist pattern can be formed precisely. In addition, remaining of an unnecessary etching residue (for example, an etching residue of the conductive film CD2) on the interlayer insulating film IL8 can be suppressed or prevented. The semiconductor device thus manufactured can have improved reliability. In addition, the semiconductor device can be manufactured at an improved yield. Further, the present embodiment facilitates management of the manufacturing steps of the semiconductor device and as a result, manufacturing steps of the semiconductor device can be carried out readily.

The interlayer insulating film IL8 formed in the present embodiment can have high flatness. After formation of the interlayer insulating film IL8, therefore, the CMP treatment (polishing treatment) for the interlayer insulating film IL8 is not necessary. This may reduce the manufacturing cost of the semiconductor device.

The present embodiment does not need formation of members corresponding to the dummy wirings DM. This may facilitate designing of the wiring M7. The present embodiment can be performed without re-designing of a wiring layout so that the present embodiment can be performed without increasing a burden and the semiconductor device can be manufactured at a reduced cost.

In Step S3, the hydrophilicity improving treatment of the surface of the insulating film IL8a is performed. As this treatment, the oxygen plasma treatment is most preferred. More specifically, after formation of the insulating film IL8a by spin coating in Step S2 and before formation of the insulating film IL8b on the insulating film IL8a by spin coating in Step S4, the oxygen plasma treatment is preferably performed in Step S3.

In this oxygen plasma treatment, the surface of the insulating film IL8a is exposed to oxygen plasma. By this treatment, an organic matter or carbon on the surface of the insulating film IL8a is removed by oxygen plasma, the surface of the insulating film IL8a has improved hydrophilicity, and wettability of the insulating film IL8a with a chemical solution (chemical solution for the formation of the insulating film IL8b) used in Step S4 is improved. This makes it possible to precisely form, by spin coating in Step S4, the insulating film IL8b on the insulating film IL8a formed by spin coating.

The oxygen plasma treatment in Step S3 is performed preferably at 170° C. or less, because at an excessively high oxygen plasma treatment temperature, stress due to modification of the surface of the insulating film IL8a may occur in the insulating film IL8a and the insulating film IL8a may presumably be cracked. In order to avoid this, the oxygen plasma treatment temperature in Step S3 is preferably reduced to some degree. According to the investigation by the present inventors, the temperature is preferably 170° C. or less. By carrying out the oxygen plasma treatment in Step S3 at 170° C. or less, the surface of the insulating film IL8a can have improved hydrophilicity and at the same time, generation of cracks in the insulating film IL8a due to the oxygen plasma treatment can be prevented without failure. The oxygen plasma treatment temperature in Step S3 set at between from room temperature to 170° C. is more preferred because a plasma treatment apparatus is not required to have a cooling mechanism of the semiconductor substrate SB.

The oxygen plasma treatment temperature corresponds to the temperature (heating temperature) of the semiconductor substrate SB when subjected to the oxygen plasma treatment. It is therefore preferred in Step S3 to carry out the oxygen plasma treatment while adjusting the temperature (heating temperature) of the semiconductor substrate SB at 170° C. or less and expose the surface of the insulating film IL8a to oxygen plasma.

In Step S3, as the hydrophilicity improving treatment of the surface of the insulating film IL8a, the oxygen plasma treatment is most preferred, but the heat treatment in an ozone ($O_3$)-containing atmosphere can be replaced for it. This means that in Step S3, the heating treatment of the semiconductor substrate SB in an ozone ($O_3$) atmosphere may be performed instead of the oxygen plasma treatment. The heat treatment temperature (temperature of the semiconductor substrate SB) in the ozone ($O_3$)-containing atmosphere is preferably from about 200 to 400° C.

Since the hydrophilicity improving effect on the surface of the insulating film IL8a is greater in the oxygen plasma treatment than in the heat treatment in the ozone ($O_3$)-containing atmosphere so that it is most preferred to carry out the oxygen plasma treatment in Step S3.

In order to achieve the hydrophilicity improving effect on the surface of the insulating film IL8a by the heat treatment in an oxygen ($O_2$) atmosphere, the heat treatment temperature should be set very high. The heat treatment at such a high temperature may have various harmful influences (for example, harmful influence on wirings) so that it is desirably avoided. The oxygen plasma treatment or the heat treatment in the ozone ($O_3$)-containing atmosphere, on the other hand, can produce the hydrophilicity improving effect on the surface of the insulating film IL8a even without setting the heat treatment temperature higher than that of the heat treatment in an oxygen ($O_2$) atmosphere. In the present embodiment, it is therefore preferred to employ, as the hydrophilicity improving treatment on the surface of the insulating film IL8a, the oxygen plasma treatment or heat treatment in an ozone ($O_3$)-containing atmosphere, with the oxygen plasma treatment being most preferred.

In the present embodiment, the insulating film IL8a formed by spin coating in Step S2 and the insulating film IL8b formed by spin coating in Step S4 are made of preferably the same material, more preferably silicon oxide. When the insulating film IL8a and the insulating film IL8 are made of the same material, not a technical concept of the present embodiment in which the insulating films IL8a and the insulating film IL8b are formed by respectively different spin coating steps but the above-mentioned Second Investigation Example in which an interlayer insulating film having, in total, the thickness of the insulating film IL8a and the thickness of the insulating film IL8b is formed by a single spin coating step may be employed from the standpoint of reducing the number of manufacturing steps as much as possible. Finding the problem that the interlayer insulating film IL208 in Second Investigation Example is likely to have, on the surface thereof, the step difference DS, the present inventors investigated how to form a highly flat interlayer insulating film by spin coating. As a result, they have completed the technology of, not forming a thick interlayer insulating film by a single spin coating step but stacking a plurality of the insulating films IL8a and IL8b, each formed by a spin coating step, to form the interlayer insulating film IL8 and performing the hydrophilicity improving treatment of the insulating film IL8a between the insulating film IL8a formation step and the insulating film IL8b formation step.

Thickness T1 of the insulating film IL8a formed in Step S2 is preferably equal to or greater than Thickness T2 of the insulating film IL8b formed in Step S4 (T1≥T2). It is preferred to satisfy T1≥T2, wherein T1 represents the thickness of the insulating film IL8a formed in Step S2 and T2 represents Thickness T2 of the insulating film IL8b formed in Step S4. The reason for it will next be described.

When the insulating film IL8a is formed in Step S2, a step difference of an underlying film nearly corresponds to the thickness of the wiring M7, meaning that the step difference is considerably large. When the chemical solution for the formation of the insulating film IL8a is applied onto the main surface of the semiconductor wafer while having such a step difference, the thickness of the resulting film formed by application becomes very thin on the wiring M7. A baking treatment subsequent thereto is then performed to complete the formation of the insulating film IL8a. Compared with the thickness of the insulting film IL8a in a region having therein no wiring M7, the thickness of the insulating film IL8a on the wiring M7 is considerably thin. When the insulating film IL8b is formed in Step S4, on the other hand, a step difference of the insulating film IL8a lying thereunder is smaller than the thickness of the wiring M7 because the insulating film IL8a is formed by spin coating. Compared with the time when the insulating film IL8a is formed in Step S2, the step difference of an underlying film becomes very small at the time when the insulating film IL8b is formed in Step S4. When a film is formed on the main surface of the semiconductor wafer by applying the chemical solution for the formation of the insulating film IL8b under such a state, the resulting film tends to be thick to a certain degree even on the wiring M7. The baking treatment is then performed to complete the formation of the insulating film IL8b, but the insulating film IL8b tends to be thick to a certain degree even on the wiring M7.

In order to decrease the thickness of the interlayer insulating film IL8 on the wiring M7 while maintaining the flatness of the interlayer insulating film IL8, it is therefore more advantageous to increase the thickness of the insulating film IL8a formed in Step S2 than to increase the thickness of the insulating film 8b formed in Step S4. In addition, since the through-hole SH in the interlayer insulating film IL8 is formed on the wiring M7, it is advantageous to decrease the thickness of the interlayer insulating film IL8 on the wiring M7 to facilitate formation of the through-hole SH. Thickness T1 of the insulting film IL8a formed in Step S2 is preferably equal to or greater than Thickness T2 of the insulating film IL8b formed in Step S4 (T1≥T2). It is more preferred that Thickness T1 of the insulting film IL8a formed in Step S2 is greater than Thickness T2 of the insulating film IL8b formed in Step S4 (T1>T2). This makes it possible to decrease the thickness of the interlayer insulating film IL8 on the wiring M7 while keeping the flatness of the interlayer insulating film IL8. The thickness of the interlayer insulating film IL8 on the wiring M7 can be decreased, facilitating formation of the through-hole SH in the interlayer insulating film IL8.

Thickness T1 of the insulating film IL8a formed in Step S2 corresponds to the thickness of the insulating film IL8a in a region having therein no wiring M7 and is shown above in FIGS. 20 and 22. Thickness T2 of the insulating film IL8b formed in Step S4 corresponds to the thickness of the insulating film IL8b in a region having therein no wiring M7 and is shown above in FIG. 22.

The method of forming the interlayer insulating film IL8 described in the present embodiment or described later in Second Embodiment can be applied to at least any one of the interlayer insulating films IL1, IL2, IL3, IL4, and IL5. This means that the method of forming the interlayer insulating film IL8 described in the present embodiment or described later in Second Embodiment can be applied to any one, any two, any three, any four, or all of the five interlayer insulating films IL1, IL2, IL3, IL4, and IL5.

When the interlayer insulating film IL8 is any of the interlayer insulating films IL2, IL3, IL4, and IL5, the interlayer insulating film IL8 is formed on the underlying interlayer insulting film IL7 so as to cover the wiring M7 (refer to FIGS. 7, 9, 11, 13, and 22). In this case, there is a fear of a step difference or unevenness attributable to the wiring M7 (M1, M2, M3, or M4) appearing on the surface of the interlayer insulating film IL8 (IL2, IL3, IL4, or IL5). Formation of the interlayer insulating film IL8 by the method described in the present embodiment or described later in Second Embodiment can however suppress or prevent a step difference or unevenness attributable to the wiring M7 from being formed on the surface (upper surface) of the interlayer insulating film IL8. The interlayer insulating film IL8 (IL2, IL3, IL4, or IL5) formed to cover the wiring M7 (M1, M2, M3, or M4) can therefore have improved surface flatness. Thus, the interlayer insulating film IL8 (IL2, IL3, IL4, or IL5) having a flat surface can be formed.

When the interlayer insulating film IL8 is the interlayer insulating film IL1, the interlayer insulating film IL8 (IL1) is formed on the semiconductor substrate SB so as to cover the gate electrodes (GE1, GE2) (refer to FIG. 4 and FIG. 22). In this case, in FIGS. 19 to 27 shown above and FIGS. 38 to 41 shown below and description associated therewith, the interlayer insulating film IL7 is replaced by the semiconductor substrate SB, the wiring M7 is replaced by the gate electrodes (GE1, GE2), the via portion V8 corresponds to the via portion V1, and the wiring M8 corresponds to the wiring M1. The gate electrodes (GE1, GE2) are however formed on the semiconductor substrate SB via the gate insulating film (GF). When the interlayer insulating film IL8 is the interlayer insulating film ILL there is a fear of a step difference or unevenness attributable to the gate electrodes (GE1, GE2) appearing on the surface of the interlayer insulating film IL8 (IL1). By forming the interlayer insulating film IL8 (IL1) by using the method described above in the present embodiment or described later in Second Embodiment, a step difference or unevenness attributable to the gate electrodes (GE1, GE2) can be suppressed or prevented from being formed on the surface (upper surface) of the interlayer insulating film IL8 (IL1). The interlayer insulating film IL8 (IL1) formed to cover the gate electrodes (GE1, GE2) can have improved surface flatness and the interlayer insulating film IL8 (IL1) having a surface with improved flatness can be formed.

In the present embodiment, with respect to a wiring structure (multilayer wiring structure) formed on the semiconductor substrate SB, that including five wiring layers is given as an example. The wiring structure is not limited to it but it may be a wiring structure including six or more wiring layers or four or less wiring layers. The method of forming the interlayer insulating film IL8 described in the present embodiment or described later in Second Embodiment can be applied to at least any one of a plurality of interlayer insulating films formed on the semiconductor substrate SB.

Second Embodiment

Figure 37:
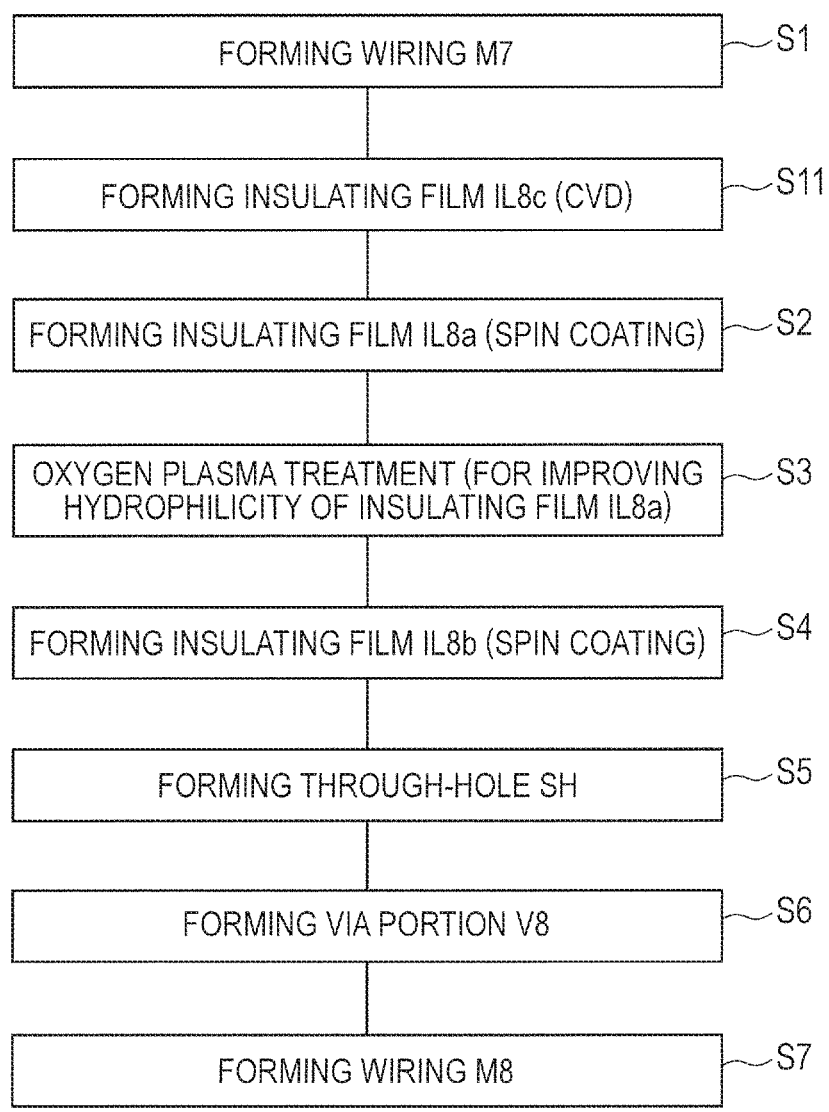
FIG. 37 is a process flow chart showing some of manufacturing steps of a semiconductor device of Second Embodiment.

Steps of forming an interlayer insulating film according to Second Embodiment will be described referring to FIGS. 37 to 41. FIG. 37 is a process flow chart showing some of manufacturing steps of a semiconductor device of Second Embodiment. FIGS. 38 to 41 are fragmentary cross-sectional views of the semiconductor device of Second Embodiment during manufacturing steps thereof. Also in FIGS. 38 to 39, as in FIGS. 17 to 26, a structure below the interlayer insulating film IL7 is omitted from these drawings.

Second Embodiment is different from First Embodiment in that after an insulating film IL8a is formed by CVD before Step S2, an insulating film IL8a is formed on the resulting insulating film IL8c (CVD film) by spin coating in Step S2. Manufacturing steps of the semiconductor device according to Second Embodiment are essentially similar to those of the semiconductor device according to First Embodiment except for the above-described difference. The difference of Second Embodiment from First Embodiment will hereinafter be described mainly and description on members common to them is omitted.

The manufacturing steps of Second Embodiment are similar to those of First Embodiment until the structure shown in FIG. 19 is obtained. In other words, also in Second Embodiment, the structure shown in FIG. 19 is obtained by forming the wiring M7 on the interlayer insulating film IL7 in Step S1 as in First Embodiment.

Figure 38:
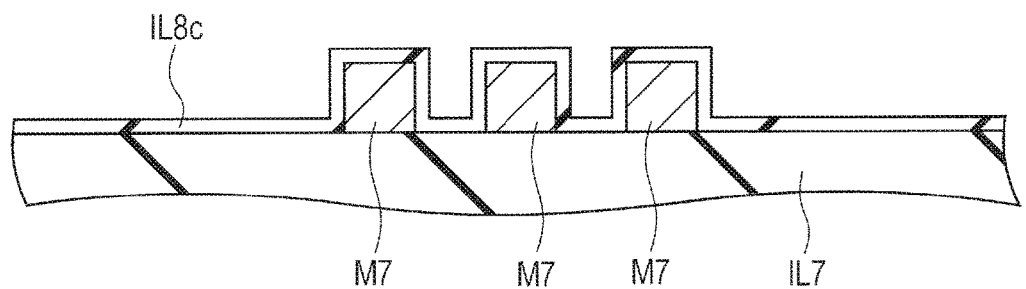
FIG. 38 is a fragmentary cross-sectional view of the semiconductor device of Second Embodiment during a manufacturing step thereof.

In Second Embodiment, after the structure of FIG. 19 is obtained, an insulating film IL8c is formed using CVD on the interlayer insulating film IL7 so as to cover the wiring M7 as shown in FIG. 38 (Step S11 of FIG. 37).

The insulating film IL8c is made of preferably a silicon oxide film and can be formed by preferably CVD, more preferably plasma CVD.

The insulating film formed using CVD has such a property that it is conformal to an underlying shape. Since the insulating film IL8c is formed using CVD, it is conformal to the wiring M7. The insulating film IL8c therefore has a step difference or unevenness reflecting the shape of the wiring M7. The thickness of a portion of the insulating film IL8c formed on the interlayer insulating film IL7 in a region having therein no wiring M7, the thickness of a portion of the insulating film IL8c formed on the upper surface of the wiring M7, and the thickness of a portion of the insulating film IL8c formed on the side surface of the wiring M7 are almost equal to one another.

An insulating film formed using CVD is superior in film quality to an insulating film formed using spin coating. For example, an insulating film formed using CVD is denser, has lower hygroscopicity, and has higher mechanical strength than an insulating film formed using spin coating. By covering the wiring M7 with the insulating film IL8c formed using CVD, the wiring M7 therefore can have improved reliability and the semiconductor device thus obtained can have improved reliability.

Steps subsequent to the above step are essentially similar to those of First Embodiment.

Figure 39:
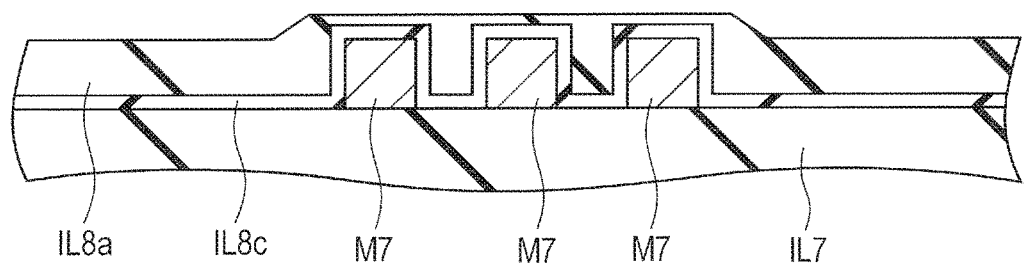
FIG. 39 is a fragmentary cross-sectional view of the semiconductor device during a manufacturing step following that of FIG. 38.

Also in Second Embodiment, as shown in FIG. 39, the insulating film IL8a is formed on the main surface (entire main surface) of the semiconductor substrate SB, that is, on the insulating film IL8c by spin coating in Step S2.

In First Embodiment having no insulating film IL8c, the insulating film IL8a is formed on the interlayer insulating film IL7 so as to cover the wiring M7 in Step S2, while in Second Embodiment having the insulating film IL8c, the insulating film IL8a is formed on the insulating film IL8c in Step S2. The insulating film IL8a is contiguous, at the lower surface thereof, to the upper surface of the insulating film IL8c. Second Embodiment is similar to First Embodiment except for the above difference. Second Embodiment is therefore similar to First Embodiment also in the formation method or material of the insulating film IL8a.

In forming an insulating film by spin coating, hydrophilicity of a film lying below the insulating film is important. When the underlying film is a CVD film, an insulating film can be formed on the CVD film easily and precisely by spin coating because of relatively high hydrophilicity of the surface of the CVD film. After formation of the insulating film IL8c by CVD in Step S11, the insulating film IL8a can be formed by spin coating in Step 2 without performing a treatment corresponding to Step S3 such as oxygen plasma treatment. This can contribute to reduction in the number of manufacturing steps.

Figure 40:
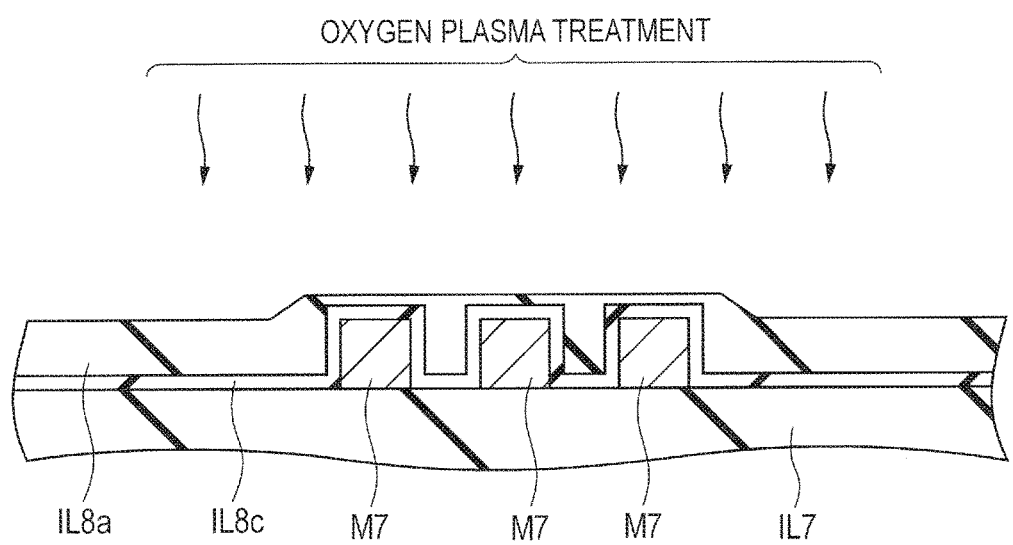
FIG. 40 is a fragmentary cross-sectional view of the semiconductor device during a manufacturing step following that of FIG. 39.
Figure 41:
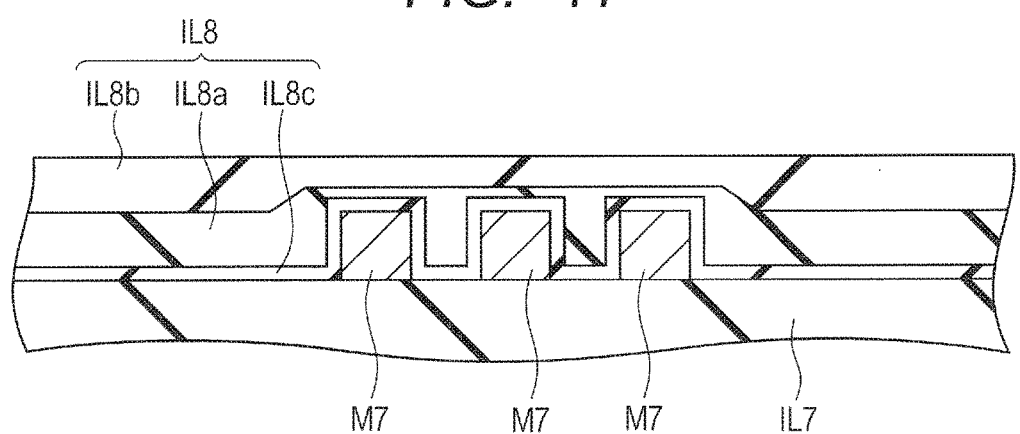
FIG. 41 is a fragmentary cross-sectional view of the semiconductor device during a manufacturing step following that of FIG. 40.

After formation of the insulating film IL8a in Step S2, the treatment of Step S3 is performed also in Second Embodiment as in First Embodiment. Described specifically, as shown in FIG. 40, the surface of the insulating film IL8a is subjected to the oxygen plasma treatment. This treatment in Step S3 is the hydrophilicity improving treatment of the surface of the insulating film IL8a as described above in First Embodiment.

Step S3 in Second Embodiment is similar to that in First Embodiment so that Second Embodiment is similar to First Embodiment also in various points including the method or meaning of Step S3, or replaceability of the oxygen plasma treatment with the heat treatment in an ozone ($O_3$) atmosphere.

In Second Embodiment similar to First Embodiment, the insulating film IL8b is then formed on the main surface (entire main surface) of the semiconductor substrate SB, that is, on the insulating film IL8a by spin coating in Step S4.

With respect to Step S4, Second Embodiment is similar to First Embodiment. Also with respect to the formation method or material of the insulating film IL8b, Second Embodiment is therefore similar to First Embodiment.

By carrying out Steps S11, S2, S3, and S4 as described above, an interlayer insulating film IL8 comprised of a film (stacked insulating film) obtained by stacking the insulating film IL8c, the insulating film IL8a on the insulating film IL8c, and the insulating film IL8b on the insulating film IL8a is formed. Therefore, Steps S11, S2, S3, and S4 can also be regarded as a step of forming the interlayer insulating film IL8.

In First Embodiment, the interlayer insulating film IL8 does not have the insulating film IL8c formed by CVD and is comprised of a stacked film of the insulating film IL8a and the insulating film IL8b on the insulating film IL8a. In Second Embodiment, the interlayer insulating film IL8 has, as the lowermost layer thereof, the insulating film IL8c formed by CVD and is comprised of a stacked film of the insulating film IL8c, the insulating film IL8a on the insulating film IL8c, and the insulating film IL8b on the insulating film IL8a. The interlayer insulating film IL8 is formed on the interlayer insulating film IL7 so as to cover the wiring M7.

In the above-described First Investigation Example having the whole interlayer insulating film formed by CVD, a CMP treatment is required after formation of the interlayer insulating film. In Second Embodiment, since the insulating films IL8a and IL8b are formed by spin coating and stacked one after another on the insulating film IL8c formed by CVD, the CMP treatment (polishing treatment) of the interlayer insulating film IL8 is not necessary after formation of the interlayer insulating film IL8. The insulating film IL8c has, on the surface thereof, a step difference or unevenness following the shape of the wiring M7, but the interlayer insulating film IL8 is formed by Steps S2, S3, and S4 so that for a reason similar to that described above in First Embodiment, the interlayer insulating film IL8 can have improved surface flatness and therefore, the interlayer insulating film IL8 having a flat surface can be formed.

After that, also in Second Embodiment similar to First Embodiment, a through-hole SH is formed in the interlayer insulating film IL8 in Step S5, a via portion V8 is formed in the through-hole SH in Step S6, and a wiring M8 is formed in Step S7. Illustration and description on them are omitted here. The through-hole SH is formed so as to penetrate through the interlayer insulating film IL8 and expose a portion of the wiring M7. In Second Embodiment, therefore, the through-hole SH penetrates through the insulating film IL8b, the insulating film IL8a, and the insulating film IL8c.

Second Embodiment can produce the following advantage in addition to the advantage available by the First Embodiment.

Described specifically, the insulating film formed by CVD has a film quality superior to that of an insulating film formed by spin coating. In the present embodiment, the wiring M7 covered by the insulating film IL8c formed using CVD can have improved reliability. As a result, the semiconductor device thus obtained can have further improved reliability.

The technical concept of First Embodiment and Second Embodiment is in that two or more insulating films each formed using spin coating are stacked one after another for the formation of an interlayer insulating film and that prior to formation of an insulating film by spin coating on the insulating film formed using spin coating, the surface of this underlying insulating film (the insulating film which has been formed using spin coating) is subjected to a hydrophilicity improving treatment (treatment corresponding to Step 3).

In First Embodiment and Second Embodiment, after Step 2 and Step S3 are performed, each once, Step 4 is performed. As another mode, after a plurality of cycles of Step S2 and Step S3 is performed, Step S4 may be performed. This means that after repeating a plurality of cycles, one cycle consisting of Step S2 and Step S3, Step S4 may be performed. In this case, a plurality of the insulating films IL8a, each formed by spin coating, is stacked and the insulating film IL8b is formed by spin coating on the stacked film comprised of the plurality of the insulating films IL8a. The spin coating step and the next spin coating step have therebetween the treatment of Step S3.

When Step S4 follows Step S2 and Step S3 performed each once, two layers of insulating films formed by respective spin coating steps are stacked. When a plurality of cycles each cycle consisting of Step S2 and Step S3 is followed by Step S4, three or more layers of the insulating films each formed by spin coating step are stacked one after another. In either case, the spin coating step and the next spin coating step have therebetween the treatment of Step S3.

Figure 42:
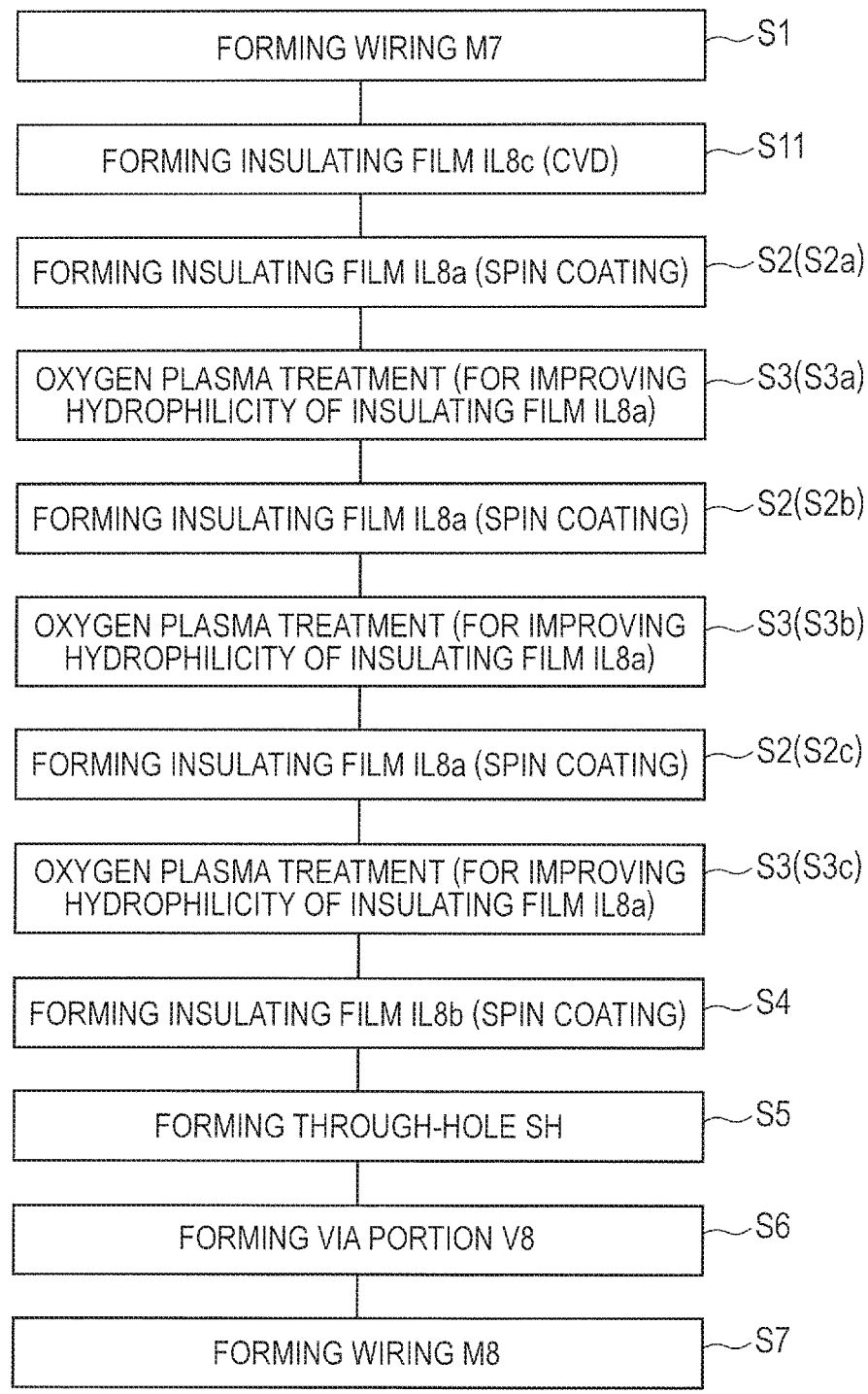
FIG. 42 is a process flow chart showing some of the manufacturing steps of the semiconductor device of another mode.

As one example, a step flow when three cycles of Step S2 and Step 3 are performed is shown in FIG. 42. In the example shown in FIG. 42, the wiring M7 is formed in Step S1, the insulating film IL8c is formed using CVD in Step S11, and then three cycles of Step S2 and Step S3 are performed. Step S2 of the first cycle will be called "Step S2a", Step S3 of the first cycle will be called "Step S3a", Step S2 of the second cycle will be called "Step S2b", Step S3 of the second cycle will be called "Step S3b", Step S2 of the third cycle will be called "Step S2c", and Step S3 of the third cycle will be called "Step S3c".

In the example shown in FIG. 42, after formation of an insulating film IL8c by CVD in Step S11, an insulating film (IL8a) is formed on the insulating film IL8c by spin coating in Step S2a, and the surface of the insulating film (IL8a) formed in Step S2a is subjected to an oxygen plasma treatment in Step S3a. An insulating film (IL8a) is then formed by spin coating on the insulating film (IL8a) subjected to an oxygen plasma treatment in Step S2b and the surface of the insulating film (IL8a) formed in Step S2b is subjected to an oxygen plasma treatment in Step S3b. In Step 2C, an insulating film (IL8a) is formed by spin coating on the insulating film (IL8a) subjected to an oxygen plasma treatment and the surface of the insulating film (IL8a) formed in Step S2c is subjected to an oxygen plasma treatment in Step S3c. An insulating film IL8b is then formed by spin coating on the insulating film (IL8a) subjected to the oxygen plasma treatment in Step S4. As a result, an interlayer insulating film is formed which is comprised of a stacked film of the insulating film IL8c, three layers of the insulating film IL8a thereon, and the insulating film IL8b thereon. Second Embodiment is applied to the example shown in FIG. 42 so that Step S11 is performed. When First Embodiment is applied, Step S11 is omitted from FIG. 42.

The thickness of the insulating film formed by a single spin coating step can be reduced when a plurality of cycles of Step S2 and Step S3 is performed compared with when a single cycle of Step S2 and Step S3 is performed. The interlayer insulating film (IL8) formed finally can have more enhanced surface flatness by performing Step S4 after a plurality of cycles of Step S2 and Step S3.

An increase in the number of cycles of Step S2 and Step S3, on the other hand, leads to an increase in the number of manufacturing steps of a semiconductor device. By carrying out Step S4 after performing Step S2 and Step S3 each once, it is therefore possible to decrease the number of manufacturing steps of a semiconductor device while enhancing the surface flatness of the interlayer insulating film (IL8).

The invention made by the present inventors has been described specifically based on Embodiments of it. It is needless to say that the present invention is not limited to the above embodiments, but can be changed in various manners without departing from the gist of the invention.

What is claimed is:

1. A method of manufacturing a semiconductor device having a first interlayer insulating film formed over a semiconductor substrate, comprising the steps of:
   (a1) forming a third insulating film by CVD,
   (a) forming a first insulating film over the third insulating film by spin coating;
   (b) subjecting a surface of the first insulating film to an oxygen plasma treatment performed at a temperature of 170° C. or less; and
   (c) after the step (b), forming a second insulating film over the first insulating film by spin coating,
   wherein the first interlayer insulating film has a stacked insulating film including the third insulating film, the first insulating film, and the second insulating film.

2. The method of manufacturing a semiconductor device according to claim 1,
   wherein the following formula: T1≥T2 is satisfied, where T1 represents a thickness of the first insulating film formed in the step (a) and T2 represents a thickness of the second insulating film formed in the step (c).

3. The method of manufacturing a semiconductor device according to claim 1,
   wherein the first insulating film and the second insulating film include the same material.

4. The method of manufacturing a semiconductor device according to claim 3,
   wherein the first insulating film and the second insulating film each include silicon oxide.

5. The method of manufacturing a semiconductor device according to claim 1,
   wherein after a plurality of cycles of the step (a) and the step (b), the step (c) is performed.

6. The method of manufacturing a semiconductor device according to claim 1,
   wherein by the oxygen plasma treatment performed in the step (b), the first insulating film has improved wettability with a chemical solution to be used for the formation of the second insulating film in the step (c).

7. The method of manufacturing a semiconductor device according to claim 1, further comprising, before the step (a), a step of:
   (a2) providing the semiconductor substrate having, over a main surface thereof, a second interlayer insulating film and a wiring over the second interlayer insulating film,
   wherein the first interlayer insulating film is formed over the second interlayer insulating film so as to cover the wiring.

8. The method of manufacturing a semiconductor device according to claim 7,
   wherein the wiring is an aluminum wiring.

9. The method of manufacturing a semiconductor device according to claim 1, further comprising, before the step (a), a step of:
   (a3) providing the semiconductor substrate having, over a main surface thereof, a gate electrode, wherein the first interlayer insulating film is formed over the semiconductor substrate so as to cover the gate electrode.

\* \* \* \* \*